United States Patent
Park et al.

(10) Patent No.: US 11,227,843 B2
(45) Date of Patent: Jan. 18, 2022

(54) DISPLAY DEVICE INCLUDING STATIC ELECTRICITY BLOCKING LINES

(71) Applicant: SAMSUNG DISPLAY CO., LTD., Yongin-si (KR)

(72) Inventors: Jun Hyun Park, Suwon-si (KR); An Su Lee, Seoul (KR); Dong Woo Kim, Yongin-si (KR); Sung Jae Moon, Seongnam-si (KR); Kang Moon Jo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/821,691

(22) Filed: Mar. 17, 2020

(65) Prior Publication Data

US 2020/0321292 A1 Oct. 8, 2020

(30) Foreign Application Priority Data

Apr. 5, 2019 (KR) .................. 10-2019-0040195

(51) Int. Cl.
*H01L 51/52* (2006.01)
*H01L 23/60* (2006.01)
*H01L 27/32* (2006.01)
*H01L 51/56* (2006.01)

(52) U.S. Cl.
CPC ............ *H01L 23/60* (2013.01); *H01L 27/322* (2013.01); *H01L 27/3248* (2013.01); *H01L 27/3262* (2013.01); *H01L 51/525* (2013.01); *H01L 51/5253* (2013.01); *H01L 51/56* (2013.01); *H01L 2227/323* (2013.01)

(58) Field of Classification Search
CPC . H01L 23/60; H01L 51/5253; H01L 27/3248; H01L 51/56; H01L 27/322; H01L 27/3262; H01L 51/525; H01L 2227/323; H01L 2251/5392; H01L 51/5246; H01L 27/3276; H01L 27/124; H01L 27/3246; H01L 27/3279; H01L 27/3272; G09G 3/3266–3291

See application file for complete search history.

(56) References Cited

U.S. PATENT DOCUMENTS

| | | | |
|---|---|---|---|
| 2016/0020264 A1* | 1/2016 | Choo | H01L 29/7869 257/40 |
| 2018/0039123 A1* | 2/2018 | Kim | G02F 1/13338 |
| 2018/0366529 A1* | 12/2018 | Lee | H01L 51/0031 |
| 2019/0355301 A1* | 11/2019 | Lee | G09G 3/3275 |
| 2020/0177719 A1* | 6/2020 | Kim | G06F 1/1688 |

FOREIGN PATENT DOCUMENTS

| | | |
|---|---|---|
| JP | 2017173505 | 9/2017 |
| KR | 10-2005-0082260 | 8/2005 |
| KR | 10-1222537 | 1/2013 |
| KR | 10-2016-0093137 | 8/2016 |
| KR | 10-2016-0136517 | 11/2016 |

* cited by examiner

*Primary Examiner* — Shahed Ahmed
(74) *Attorney, Agent, or Firm* — F. Chau & Associates, LLC

(57) ABSTRACT

A display device includes a substrate that includes a display area and a non-display area. A driver is disposed in the non-display area, and includes a driver circuit including a transistor and a driver control line transmitting a control signal to the driver circuit. A static electricity blocking line is disposed in the non-display area and circumscribes the display area. The static electricity blocking line at least partially overlaps the driver.

20 Claims, 18 Drawing Sheets

DISPLAY DEVICE INCLUDING STATIC ELECTRICITY BLOCKING LINES

CROSS-REFERENCE TO RELATED APPLICATION

This application claims priority to and the benefit of Korean Patent Application No. 10-2019-0040195, filed in the Korean Intellectual Property Office on Apr. 5, 2019, the entire contents of which are herein incorporated by reference.

TECHNICAL FIELD

The present disclosure relates to a display device and, more particularly, to a display device including static blocking lines.

DISCUSSION OF THE RELATED ART

An organic light emitting diode (OLED) display device includes a display panel manufactured by forming light emitting elements on a substrate, and circuit elements for driving the light emitting elements.

The display panel may primarily include a display area where a screen is formed, but a specific area of the display panel, particularly, an edge area, may be a non-display in which no image is displayed. This non-display area is often covered by a bezel of the display device and so the smaller the non-display area is, the less bezel may be present in the display device. A driver circuit, a signal line, and the like may be disposed in the non-display area.

Display devices are often incorporated into various electronic device (e.g., a smart phone, a tablet PC, a laptop, a television, a monitor, and the like). These display devices may have a large screen-to-body ratio by reducing a size of the non-display area.

To reduce the non-display area of the display device, elements disposed in the non-display area can be designed with a smaller size or omitted, which may deteriorate the reliability of the display device.

SUMMARY

A display device, according to an exemplary embodiment of the present disclosure includes a substrate having a display area and a non-display area. A driver is disposed in the non-display area, and includes a driver circuit having a transistor and a driver control line transmitting a control signal to the driver circuit. A static electricity blocking line is disposed in the non-display area and surrounds the display area. The static electricity blocking line overlaps the driver.

The static electricity blocking line may at least partially overlap the driver circuit.

The static electricity blocking line may at least partially overlap the driver control line.

The display device may further include a dam that is disposed in the non-display area and at least partially surrounds the display area. The dam may at least partially overlap the static electricity blocking line.

A width of the static electricity blocking line may be smaller than a width of a bottom surface of the dam, and the dam may wholly cover the static electricity blocking line.

The dam may include a lower layer and an upper layer disposed on the lower layer, and the static electricity blocking line may be disposed between the lower layer and the upper layer.

The static electricity blocking line may be disposed in an upper portion of the dam.

A width of the static electricity blocking line may be larger than a width of a bottom surface of the dam, and the dam may cover a part of the static electricity blocking line.

The display device may further include a light emitting element disposed in the display area. The light emitting element may include a first electrode, an emission layer disposed on the first electrode, and a second electrode disposed on the emission layer. The second electrode may extend to an area where the dam is located and may thus cover an upper portion of the dam in the non-display area.

The display device may further include an encapsulation layer that covers the display area and seals the light emitting element. The static electricity blocking line may include a plurality of static electricity blocking lines that each extend in parallel with each other. One part of the plurality of static electricity blocking lines may be covered by the encapsulation layer, and the other part might not be covered by the encapsulation layer.

The static electricity blocking line may include a plurality of static electricity blocking lines that each extend in parallel with each other. The display device may further include a connection line that connects the plurality of static electricity blocking lines with each other. The connection line may transmit a common voltage to the plurality of static electricity blocking lines.

The display device may further include a mask support that is disposed farther away from the display area than the dam in the non-display area, and the mask support may at least partially overlap only one of the plurality of static electricity blocking lines, while surrounding the display area.

A display device according, to an exemplary embodiment of the present invention, includes a first substrate includes a display area and a non-display area. A plurality of transistors is disposed on the first substrate. A first electrode is disposed on a first transistor disposed in the display area among the plurality of transistors and electrically connected with one electrode of the first transistor. An emission layer is disposed on the first electrode. A second electrode is disposed on the emission layer. A contact layer is disposed between the one electrode of the first transistor and the first electrode and electrically connects the one electrode of the first transistor and the first electrode by contacting the same. A static electricity blocking line is disposed at the same layer as the contact layer in the non-display area and the static electricity blocking line at least partially surrounds the display area.

The display device may further include a driver that has a driver circuit including a second transistor disposed in the non-display area among the plurality of transistors and a driver control line that transmits a control signal to the driver circuit. The static electricity blocking line may at least partially overlap the driver.

The display device may further include a dam that is disposed in the non-display area, at least partially surrounds the display area, and at least partially overlaps the static electricity blocking line.

A width of the static electricity blocking line may be smaller than a width of a bottom surface of the dam, and the dam may wholly cover the static electricity blocking line.

A width of the static electricity blocking line may be larger than a width of a bottom surface of the dam, and the dam may cover a part of the static electricity blocking line.

The second electrode may extend to an area where the dam is located and thus may cover an upper portion of the dam in the non-display area.

A display device, according to an exemplary embodiment of the present invention, includes a substrate having a display area and a non-display area. First to third static electricity blocking lines are disposed on the non-display area and thus at least partially surround the display area. The first to third static electricity blocking lines extend in parallel with each other. A first dam is disposed in the non-display area, at least partially surrounds the display area, and at least partially overlaps the first static electricity blocking line. A second dam is disposed in the non-display area, at least partially surrounds the display area, and at least partially overlaps the second static electricity blocking line. A mask support is disposed in the non-display area, at least partially surrounds the display area, and at least partially overlaps the third static electricity blocking line. A connection line connects the first to third static electricity blocking lines to each other, and transmits a common voltage to the first to third static electricity blocking lines.

The display device may further include a light emitting element that is disposed in the display area. An encapsulation layer may cover the display area, and may seal the light emitting element. The first static electricity blocking line and the second static electricity blocking line may be covered by the encapsulation layer, and the third static electricity blocking line might not be covered by the encapsulation layer.

According to exemplary embodiments of the present invention, a circuit such as a driver circuit disposed in a non-display area of a display panel can be protected from static electricity while reducing a size of the non-display area.

BRIEF DESCRIPTION

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
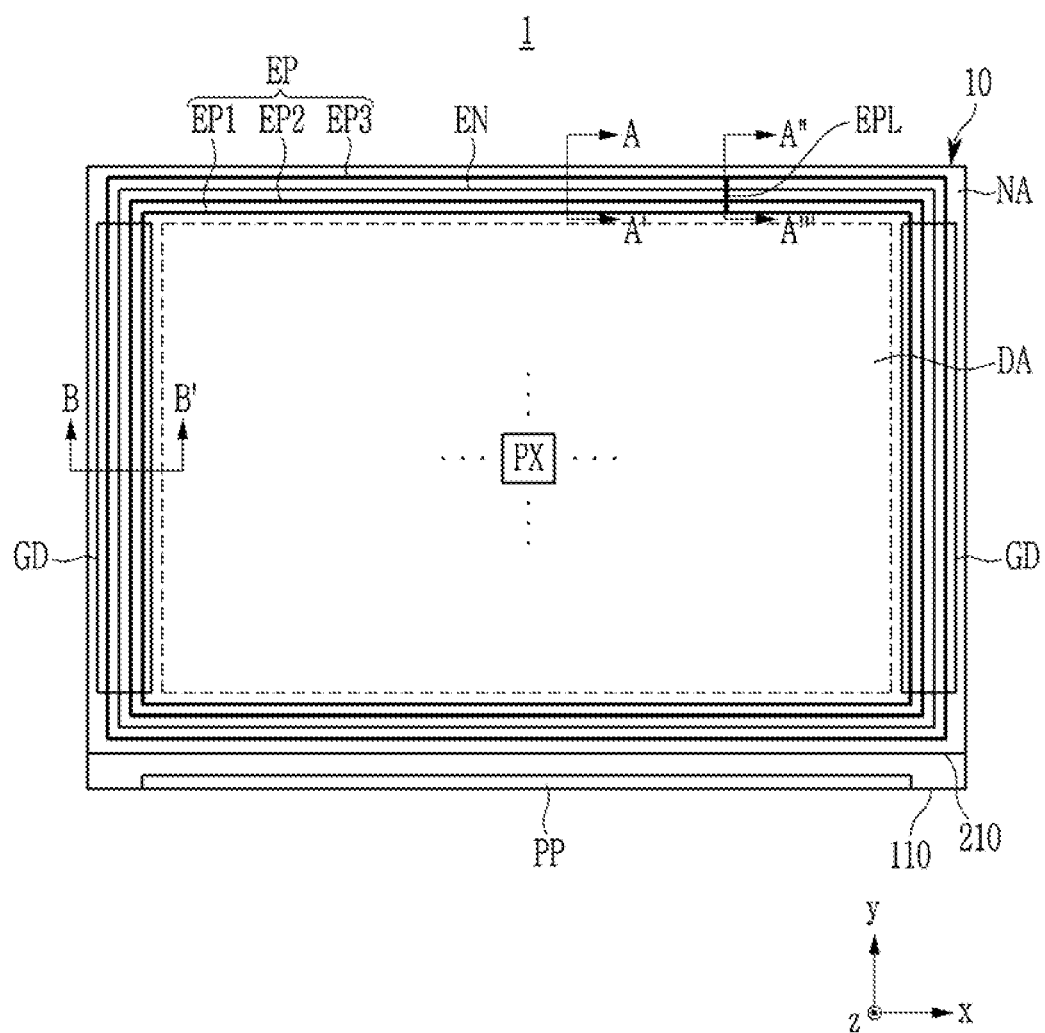
FIG. 1 is a top plan view illustrating a display device according to an exemplary embodiment of the present invention.

In the following detailed description, exemplary embodiments of the present invention have been shown and described for the purpose of illustration. As those skilled in the art would realize, the described embodiments may be modified in various different ways, all without departing from the spirit or scope of the present invention.

Accordingly, the drawings and description may be regarded as illustrative to one or more particular exemplary embodiments of the present invention, and should not be seen as limiting to all embodiment thereof or to the invention, more generally. Like reference numerals may designate like elements throughout the specification and drawings.

The size and the thickness of the various elements shown in the drawings, such as the thickness of layers, regions, etc., may be exaggerated for clarity.

It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements whereas the use of the phrase "consisting of" will be understood to imply the exclusive inclusion of the stated elements, and no other element.

In the drawings, the symbol x used to represent a first direction, the symbol y is a second direction perpendicular to the first direction, and the symbol z is a third direction that is perpendicular to the first direction and the second direction. Thus, the symbols x, y, and z are understood to be the Cartesian coordinates, however, the structures shown may be rotated in any manner from what is illustrated.

Hereinafter, a display device according to exemplary embodiments of the present invention will be described in detail with reference to the accompanying drawings.

FIG. 1 is a top plan view illustrating a display device according to an exemplary embodiment of the present invention.

Referring to FIG. 1, a display device 1 includes a display panel 10 that includes a display area DA and a non-display area NA. The display area DA and the non-display area NA may occupy different areas as seen in the plan view. In FIG. 1, the inside of the dotted line quadrangle that separated the display area DA from the non-display area NA corresponds to the display area DA, and the outside of the dotted line quadrangle corresponds to the non-display area NA.

In the display panel 10, the display area DA corresponds to a screen where an image is displayed. Circuits and/or signal lines that generate and/or transmit various signals applied to the display area DA may be disposed in the non-display area NA, at the periphery of the display area DA. The non-display area NA may at least partially surround the display area DA. For example, the non-display area NA may surround the display area DA at one, two, three or all four sides.

A plurality of pixels PX, a plurality of gate lines (also referred to as scan lines), a plurality of data lines, and a driving voltage line are disposed in the display panel 10. Each pixel PX is connected with a gate line, a data line, and the driving voltage line. Each pixel PX may receive a gate signal (also referred to as a scan signal), a data signal, and a driving voltage from the signal lines, respectively. Each pixel PX may include a light emitting element. The light emitting element may be, for example, an organic light emitting element. In the display area DA, signal lines such as sensing lines, light emission control signal lines, and/or other signal lines may be further disposed.

A touch sensor layer, that senses contact touch (e.g. a touch in which contact is made with the display device) or non-contact touch (e.g. where an object is brought into close proximity to the display device) of a user, may be disposed in the display area DA.

In FIG. 1, a quadrangular-shaped display area DA is exemplarily illustrated, but the display area DA may have various shapes such as a polygon, a circle, an oval, and the like, or an arbitrary shape such as a shape of a polygon with rounded corners.

The non-display area NA of the display panel 10 may include a pad portion PP that includes pads for receiving signals from outside the display panel 100. The pad portion PP may be disposed along an edge of the display panel 10. For example, the pad portion PP may extends in a first direction x along one edge of the display panel 10. The display device 1 may include a flexible printed circuit board that is bonded to the pad portion PP. Pads of the flexible printed circuit board may be electrically connected to the pads of the pad portion PP. Depending on the size of the display panel 10, the display panel 10 may include a plurality of pad portions PP that are spaced apart from each other in the first direction x at predetermined intervals, and each pad portion PP may be bonded with one flexible printed circuit board. In FIG. 1, the pad portion PP is exemplarily shown as being disposed at a lower end portion of the display panel 10, but the pad portion PP may be disposed at an upper end portion of the display panel 10 or both of the lower end portion and the upper end portion of the display panel 10.

The display device 1 includes a driving unit disposed in the non-display area NA of the display panel 10. The driving unit may generate and/or process various signals for driving the display panel 10. The driving unit may include a data driver that applies a data signal to data lines, a gate driver GD that applies a gate signal to gate lines, and a signal controller that controls the data driver and the gate driver GD.

The display panel 10 may include a first substrate 110 that includes the display area DA and the non-display area NA, and the gate driver GD may be integrated with the non-display area NA of the first substrate 110 of the display panel 10. The gate driver GD may be disposed at two opposite sides or at one side of the display area DA. The data driver may be provided in the form of an IC chip, and may be disposed in the flexible printed circuit board connected to a pad portion PP or the non-display area NA of the display panel 10. The signal controller may be provided in the form of the IC chip, and may be disposed in a printed circuit board that is bonded to the flexible printed circuit board. The data driver and the signal controller may each be provided in the form of an integrated circuit IC.

The gate driver GD disposed in the non-display area NA is connected with gate lines and applies a gate signal to the pixels PX. The gate driver GD may be integrated with the non-display area NA. The gate driver GD receives driver controlling signals such as a vertical start signal, a clock signal, and a low voltage that conforms to a gate off signal from the signal controller, generates a gate signal (e.g., a gate on voltage and a gate off voltage), and applies the gate signal to the gate lines. The gate driver GD includes a driver circuit (also referred to as a shift resistor) that generates and outputs a gate signal by using driver controlling signals. The driver circuit includes stages that are connected to each other in a dependent manner. In addition, the gate driver GD includes driver controlling signal lines that transmit driver control signals to the stages. The stages are connected one-to-one with the gate lines so that the gate signals can be sequentially output to the gate lines for each frame.

Each stage includes transistors and at least one capacitor. Some of the driver control signals may be provided from a unit other than the signal controller.

The display panel 10 includes an encapsulation layer EN that wholly covers the display area DA. The encapsulation layer EN seals the display area DA, particularly, the light emitting elements thereof, to prevent permeation of moisture or oxygen into the display panel 10, particularly, into the display area DA. An edge of the encapsulation layer EN may be disposed between an edge of the display panel 10 and the display area DA.

The non-display area NA may include a static electricity blocking line EP that protects the driver circuit of the non-display area NA or the pixels PX in the display area DA from static electricity. The static electricity blocking line EP may be disposed in the non-display area NA in the form of a closed loop that surrounds the display area NA. The static electricity blocking line EP may be formed of at least one of multiple layers of conductive materials included in the display panel 10. The static electricity blocking line EP may be provided in plural. The static electricity blocking line EP may be maintained at a ground voltage or at a common voltage.

As exemplarily illustrated in FIG. 1, the static electricity blocking line EP may include a first static electricity blocking line EP, a second static electricity blocking line EP2, and a third static electricity blocking line EP3, which extend in parallel with each other and which are concentric with each other. When the first static electricity blocking line EP1, the second static electricity blocking line EP2, and the third static electricity blocking line EP3 are sequentially disposed in the order of a distance from the display area DA, the first static electricity blocking line EP1 and the second static electricity blocking line EP2 are covered by the encapsulation layer EN and the third static electricity blocking line EP3 might not be covered by the encapsulation layer EN. The first to third static electricity blocking lines EP1, EP2, and EP3 may each at least partially overlap the gate driver GD.

The first to third static electricity blocking lines EP1, EP2, and EP3 may extend primarily in the first direction x at an upper edge and a lower edge of the display panel 10, and may extend primarily in a second direction y at a left edge and a right edge of the display panel 10. The first to third static electricity blocking lines EP1, EP2, and EP3 may be connected with each other by a connection line EPL that is disposed on at least one edge of the display panel 10. As exemplarily shown in FIG. 1, the connection line EPL may connect the first to third static electricity blocking lines EP1, EP2, and EP3 at the upper edge of the display panel 10. Depending on exemplary embodiments, the connection line EPL may connect the first to third static electricity blocking lines EP1, EP2, and EP3 at the lower edge of the display panel 10, or may connect the first to third static electricity blocking lines EP1, EP2, and EP3 on the left edge and/or the right edge of the display panel 10.

Figure 3:
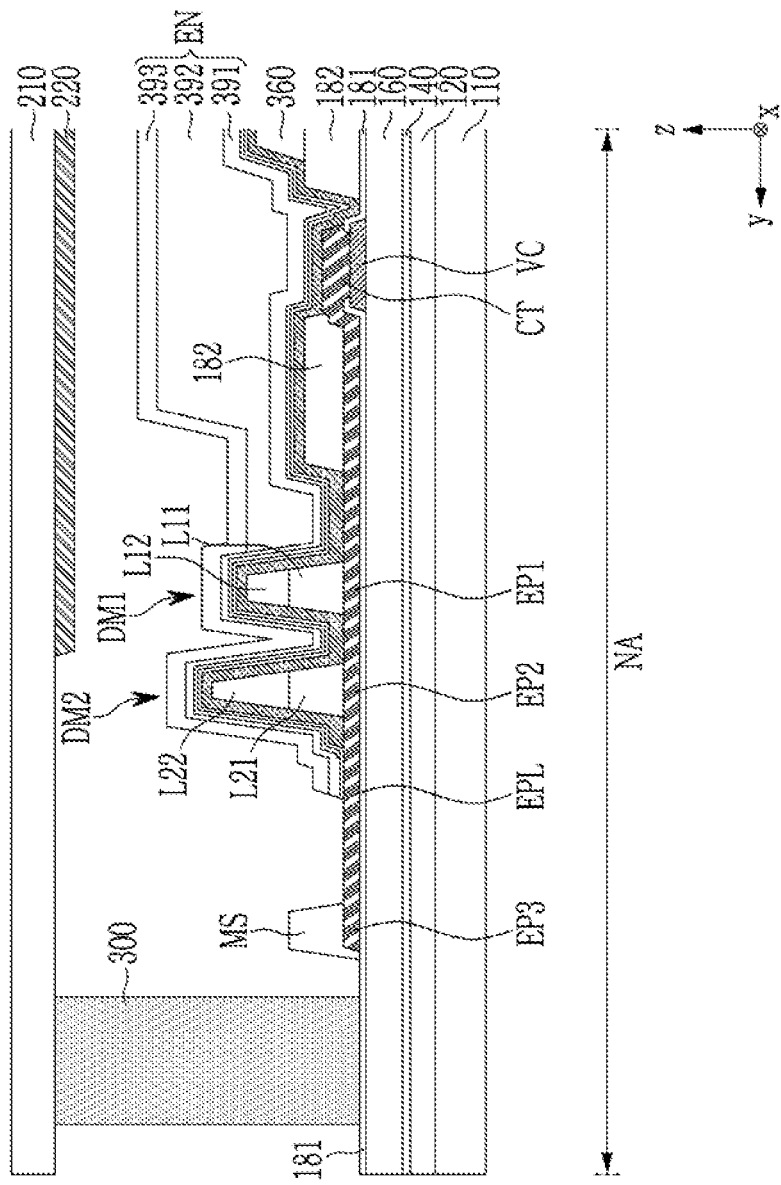
FIG. 3 is a schematic cross-sectional view illustrating an exemplary embodiment of FIG. 1, taken along the line A"-A'"
Figure 4:
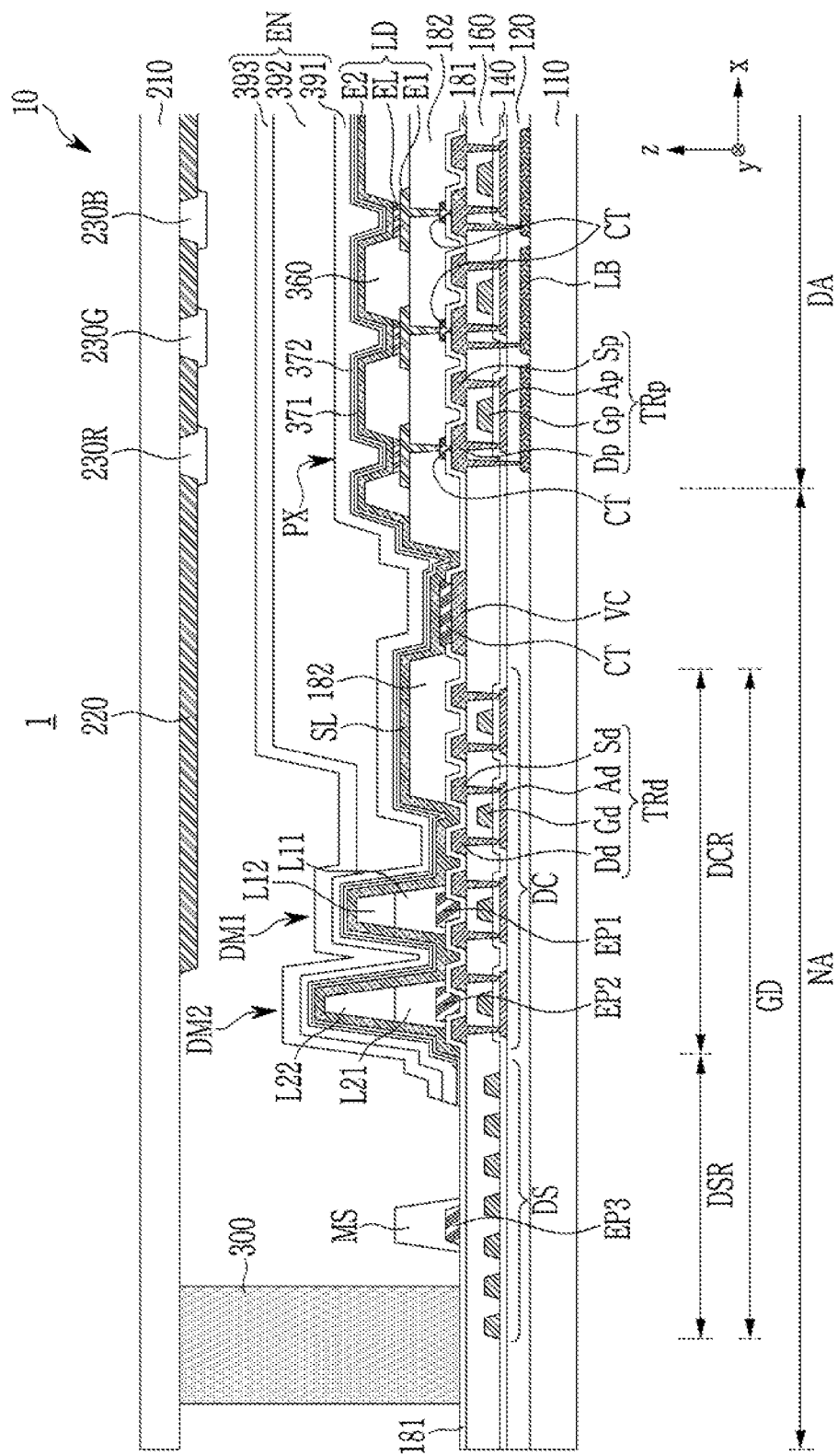
FIG. 4 is a schematic cross-sectional view illustrating an exemplary embodiment of FIG. 1, taken along the line B-B'.

Hereinafter, an exemplary embodiment of a cross-sectional structure of the display panel 10 will be described in detail with reference to FIG. 2 to FIG. 4, together with FIG. 1.

Figure 2:
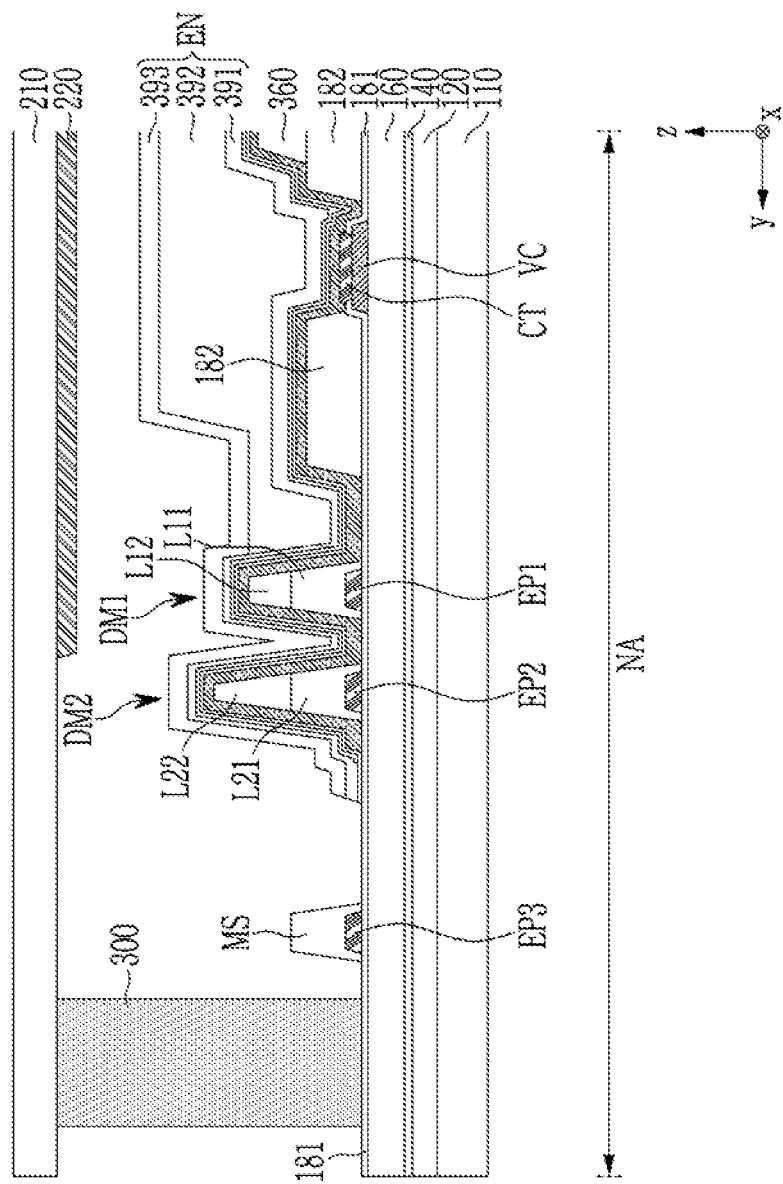
FIG. 2 is a schematic cross-sectional view illustrating an exemplary embodiment of FIG. 1, taken along the line A-A'.

FIG. 2 is a schematic cross-sectional view illustrating an exemplary embodiment of FIG. 1, taken along the line A-A'. FIG. 3 is a schematic cross-sectional view illustrating an exemplary embodiment of FIG. 1, taken along the line A"-A"'. FIG. 4 is a schematic cross-sectional view illustrating an exemplary embodiment of FIG. 1, taken along the line B-B'. FIG. 2 and FIG. 3 show cross-sectional structures of the non-display area NA at the upper edge of the display panel 10. FIG. 4 shows a cross-sectional structure of the non-display area NA and part of the display area DA at the left edge of the display panel 10. The periphery of the right edge of the display panel 10 may be approximately symmetrical with respect to the periphery of the left edge of the display panel 10.

First, the gate driver GD includes a driver circuit DC and driver control lines DS that are disposed adjacent to each other in the non-display area NA. The driver circuit DC may include transistors TRd. The driver circuit DC is disposed in a driver circuit area CDR, and the driver control lines DS are disposed in a driver control line region DSR. The driver circuit region DCR and the driver control line region DSR respectively extend in the second direction y between an edge of the display panel 10 and the display area DA. The driver circuit region DCR may be disposed closer to the display area DA than to the driver control line region DSR. The driver control lines DS is electrically connected with the driver circuit DC, and may transmit a vertical start signal, a clock signal, a low voltage of a specific level, and the like to the driver circuit DC. At least one of the driver control lines DS may be disposed in the driver circuit region DCR, or between the driver circuit region DCR and the display area DA.

In a cross-sectional view, the display panel 10 includes a first substrate 110, and several layers, wires, and elements formed on the first substrate 110. The display panel 10 may include a second substrate 210 that is bonded with the first substrate 110 by a sealant 300. A plurality of pixels PX are disposed in the display area DA of the display panel 10, and each pixel PX includes transistors, a capacitor, and light emitting elements. However, in FIG. 4, one transistor TRp and one light emitting element LD connected thereto are illustrated. In addition, the driver circuit CD of the non-display area NA includes transistors and capacitors, but in FIG. 4, several transistors TRd are illustrated.

The first substrate 110 may be a rigid substrate formed of glass, quartz, ceramic, or the like. Alternatively, first substrate 10 may be a flexible substrate that may be formed of a polymer such as a polyimide.

A buffer layer 120 is disposed on the first substrate 110, a first insulation layer 140 is disposed on the buffer layer 120, and a second insulation layer 160 may be disposed on the first insulation layer 140.

A light blocking layer LB may be disposed between the first substrate 110 and the buffer layer 120. The light blocking layer LB can prevent deterioration of a characteristic of a semiconductor layer Ap of the transistor TRp by preventing external light from reaching the semiconductor layer Ap. A current leakage of a transistor TRp, particularly, a driving transistor of which a current characteristic is important in the organic light emitting diode display, can be controlled. The light blocking layer LB may include a material that does not transmit light of a particular wavelength, or range of wavelengths, to be blocked, and for example, may be formed of a conductive material such as a metal, a metal alloy, and the like. Thus, the light blocking layer LB may function as an electrode that receives a specific voltage in the display panel 10. In this case, the rate of current change in a saturation region of a voltage-current characteristic graph of the transistor TRp is reduced, thereby increasing its functional characteristics as a driving transistor. The light blocking layer LB may be electrically connected with another transistor (e.g., a switching transistor) or a signal line (e.g., a driving voltage line), or may be in a floated state. The light blocking layer LB may be disposed below the transistor TRd of the driver circuit DC.

The buffer layer 120 disposed on the light blocking layer LB may prevent impurities from being dispersed into the semiconductor layers Ap and Ad from the first substrate 110 during a process for forming the semiconductor layers Ap and Ad, and may reduce a stress applied to the first substrate 110. The buffer layer 120 may include an inorganic insulation material such as a silicon oxide, a silicon nitride, and the like.

The semiconductor layers Ap and Ad of the transistors TRp and TRd may be disposed between the buffer layer 120 and the first insulation layer 140. The semiconductor layers Ap and Ad may include channel regions that at least partially overlap gate electrodes Gp and Gd, source regions, and drain regions. The source regions and the drain regions are doped and disposed at opposite sides of the channel regions. The semiconductor layers Ap and Ad may include polysilicon, amorphous silicon, or an oxide semiconductor.

The first insulation layer 140 disposed on the semiconductor layers Ap and Ad may include an inorganic insulation layer such as a silicon oxide, a silicon nitride, and the like. The first insulation layer 140 may be called a gate insulation layer.

A gate conductor that includes gate lines, driver control lines DS, and the gate electrodes Gp and Gd of the transistors TRp and TRd may be disposed between the first insulation layer 140 and the second insulation layer 160. The gate conductor may include a metal such as molybdenum (Mo), copper (Cu), aluminum (Al), silver (Ag), chromium (Cr), tantalum (Ta), titanium (Ti), and/or the like or a metal alloy, or may be a multiple layer of titanium (Ti)/molybdenum (Mo). The driver control lines DS may be at the same layer as the gate conductor. In the present specification, the same layer or forming the same layer means that the constituent elements are formed of the same material in the same process. For example, the driver control lines DS may be formed of the same material as the gate conductor through the same process and through the same one or more steps.

The second insulation layer 160 disposed on the first insulation layer 140 and the gate conductor may include an inorganic insulation material such as a silicon oxide, a silicon nitride, and/or the like. The second insulation layer 160 may also be called an interlayer insulation layer.

A data conductor that includes a data line, a driving voltage line, a common voltage line VC, and source electrodes Sp and Sd and drain electrodes Dp and Dd of the transistors TRp and TRd may be disposed on the second insulation layer 160.

The source electrodes Sp and Sd and the drain electrodes Dp and Dd may be connected to source regions and drain regions of the semiconductor layers Ap and Ad through contact holes formed in the first insulation layer 140 and the second insulation layer 160. One of the source electrode Sp and the drain electrode Dp may be connected to the light blocking layer LB through a contact hole formed in the buffer layer 120, the first insulation layer 140, and the second insulation layer 160.

The common voltage line VC may transmit a power voltage having a predetermined level, which can be applied to a light emitting element LD of the pixel PX or the driver circuit DC. For example, the common voltage line VC may transmit a common voltage ELVSS or a ground voltage. One end of the common voltage line VC may be electrically connected to a pad portion PP. The common voltage line VC may surround the display area DA, or may be formed in the shape of a bar that extends in the first direction x and the second direction y along edges of the display panel 10.

The data conductor may include a metal such as copper (Cu), aluminum (Al), silver (Ag), chromium (Cr), tantalum (Ta), titanium (Ti), and/or the like, or a metal alloy of one or more of the above. The data conductor may be a multiple layer such as titanium/copper (Ti/Cu), titanium/aluminum (Ti/Al), titanium/copper/titanium (Ti/Cu/Ti), titanium/aluminum/titanium (Ti/Al/Ti), molybdenum/aluminum/titanium (Mo/Al/Mo). At least a part of the driver control lines DS may be formed at the same layer as the data conductor, for example, it may be formed of the same material as the data conductor through the same process. The common voltage line VC may be formed at the same layer as the data conductor.

The gate electrode Gp, the source electrode Sp, and the drain electrode Dp form the transistor TRp together with the semiconductor layer Ap. The gate electrode Gd, the source electrode Sd, and the drain electrode Dd form the transistor TRd together with the semiconductor layer Ad. In the illustrated structure of FIG. 4, the drain electrode Dp is connected with the light blocking layer LB through the contact hole formed in the buffer layer 120, the first insulation layer 140, and the second insulation layer 160. In the transistors TRp and TRd, the gate electrodes Gp and Gd are located above the semiconductor layers Ap and Ad, but a structure of the transistor is not limited thereto, and may be various modified.

A third insulation layer 181, that includes an inorganic insulation material such as a silicon nitride, a silicon oxide, and the like, may be disposed on the second insulation layer 160 and the data conductor. The third insulation layer 181, which is an inorganic insulation layer, may also be referred to as a passivation layer. Depending on exemplary embodiments, the third insulation layer 181 may be omitted.

First to third static electricity blocking lines EP, EP2, and EP3 and a contact layer CT may be disposed on the third insulation layer 181. The first to third static electricity blocking lines EP1, EP2, and EP3 and the contact layer CT may be the same layer. For example, the first to third static electricity blocking lines EP1, EP2, and EP3 and the contact layer CT may be formed through the same process with the same material. For example, the first to third static electricity blocking lines EP1, EP2, and EP3 and the contact layer CT may be formed of a transparent conductive oxide such as ITO, IZO, and the like. In addition, the contact layer CT may be formed through the same process as one layer of a pad in the pad portion PP with the same material.

In the left edge and the right edge of the display panel 10, the first static electricity blocking line EP1 and the second static electricity blocking line EP2 may be disposed in the driver circuit region DCR, and the third static electricity blocking line EP3 may be disposed in the driver control line region DSR. In some exemplary embodiments of the present invention, the first to third static electricity blocking lines EP1, EP2, and EP3 may be disposed in the driver control line region DSR.

The first to third static electricity blocking lines EP1, EP2, and EP3 may extend in parallel with each other primarily in the first direction x at upper and lower edges of the display panel 10. As exemplarily shown in FIG. 3, the connection line EPL is at the same layer as the first to third static electricity blocking lines EP1, EP2, and EP3 and the contact layer CT. The connection line EPL extends primarily in the second direction y from the contact layer CT above the common voltage line VC to the third static electricity blocking lines EP3. Accordingly, the first to third static electricity blocking lines EP1, EP2, and EP3 are connected with each other by the connection line EPL, and are electrically connected to the common voltage line VC and thus may receive the common voltage ELVSS. The connection line EPL may transmit the common voltage ELVSS to the first to third static electricity blocking lines EP1, EP2, and EP3.

The contact layer CT may be connected to the common voltage line VC and the drain electrode Dp of the transistor TRp through contact holes formed in the third insulation layer 181. The contact layer CT may function to protect the common voltage line VC and the drain electrode Dp of the transistor TPp during a process for forming a first electrode E1 of the light emitting element LD. Depending on exemplary embodiments, the contact layer CT may be omitted.

A fourth insulation layer 182 that includes an organic insulation material may be disposed on the third insulation layer 181 and the contact layer CT. For example, the fourth insulation layer 182 may be an organic insulation layer that may include a polyimide, an acryl-based polymer, a siloxane-based polymer, and/or the like. The fourth insulation layer 182 may also be referred to as a planarization layer. The fourth insulation layer 182 may cover at least a part of the driver circuit DC.

The first electrode E1 of the light emitting element LD may be disposed on the fourth insulation layer 182. The first electrode E1 is connected with the contact layer CT through a contact hole formed in the fourth insulation layer 182, and may be electrically connected with the drain electrode Dp through the contact layer CT. The first electrode E1 may include a metal such as silver (Ag), nickel (Ni), gold (Au), platinum (Pt), aluminum (Al), copper (Cu), aluminum-neodyimium (AlNd), aluminum-nickel-lanthanum (Al-NiLa), and/or the like, or a metal alloy. The first electrode E1 may include a transparent conductive material such as an indium tin oxide (ITO), an indium zinc oxide (IZO), and/or the like. The first electrode E1 may be a multiple layer of ITO/silver (Ag)/ITO, ITO/aluminum (Al), and/or the like.

A fifth insulation layer 360 having an opening that at least partially overlaps the first electrode E1 may be disposed on the fourth insulation layer 182. The opening of the fifth insulation layer 360 may define each pixel area, and may also be referred to as a pixel defining layer. The fifth insulation layer 360 may be an organic insulation layer including an organic insulating material.

An emission layer EL is disposed on the first electrode E1. The emission layer EL is disposed in a pixel area defined by the opening of the fifth insulation layer 360.

A second electrode E2 is disposed on the emission layer EL. The second electrode E2 may cover the entire display area DA. The second electrode E2 extends to the non-display area NA and thus may contact the contact layer CT that is connected to the common voltage line VC. Accordingly, the second electrode E2 may be applied with the common voltage ELVSS. The second electrode E2 may be formed of a thin metal layer having a low work function such as calcium (Ca), barium (Ba), magnesium (Mg), and aluminum (Al), and thus may have light transmittance. As used herein, the phrase "low work function metal" may be any metal having a work function that is within a range of work functions of the metals named or a metal that has a lower work function than any of the metals named. The second electrode E2 may include a transparent conductive material such as ITO, IZO, and the like.

The second electrode E2 may extend to the driver circuit area DCR in the non-display area NA and thus may form a shielding layer SL that at least partially overlaps the driver circuit DC. For example, the shielding layer SL overlapping the driver circuit DC may be formed at the same layer as the second electrode E2. The first static electricity blocking lines EP1 and the second static electricity blocking lines EP2 may at least partially overlap the second electrode E2, for example, the shielding layer SL. The third static electricity blocking lines EP3 might not overlap the second electrode E2. Since the shielding layer SL is connected with the second electrode E2, the shielding layer SL may be applied with the common voltage ELVSS.

The transistor TRd that forms the driver circuit DC may be damaged when static electricity is introduced because the transistors TRd are weak to static electricity. The shielding layer SL may shield the driver circuit DC to prevent the driver circuit DC from being damaged by static electricity during a manufacturing process of the display device 1 or in the handling of the display device 1. The shielding layer SL may cover at least a part of the driver circuit DC, almost all of the driver circuit DC, or the entire driver circuit DC. The shielding layer SL may extend primarily in the second direction y as the driver circuit DC is disposed.

A first electrode E1, an emission layer EL, and a second electrode E2 of each pixel PX form a light emitting element LD such as an organic light emitting diode. The first electrode E1 may be an anode of the organic light emitting diode, and the second electrode E2 may be a cathode of the organic light emitting diode. The first electrode E1 may be referred to as a pixel electrode, and the second electrode E2 may be referred to as a common electrode. The light emitting elements LD may be configured to emit blue light or white light. Alternatively, the light emitting elements LD may be configured to emit light of three primary colors, for example, red light, green light, and blue light.

A capping layer 371 is disposed on the second electrode E2, and a functional layer 372 may be disposed on the capping layer 371. The capping layer 371 may serve to increase light efficiency through adjustment of a refractive index. The functional layer 372 may function to prevent lower layers of the encapsulation layer EN from being damaged when the encapsulation layer EN is formed and to increase light efficiency. The capping layer 371 may include an inorganic insulating material, and the functional layer 372 may include a material such as lithium fluoride. The capping layer 371 may extend further towards the non-display area NA from the display area DA than the second electrode E2 such that the capping layer 371 may contact the third insulation layer 181 in the non-display area NA. The functional layer 372 may extend to the non-display area NA from the display area DA like the second electrode E2, it may extend less than the second electrode E2, or it may extend to the same extent as the capping layer 371. Depending on exemplary embodiments, the capping layer 371 and the functional layer 372 may cover a part of the shielding layer SL.

The encapsulation layer EN may be disposed on both the capping layer 371 and the functional layer 372. The encapsulation layer EN may prevent permeation of external moisture or oxygen by encapsulating the light emitting element LD. The encapsulation layer EN may cover the entire display area DA. An edge of the encapsulation layer EN may be disposed in the non-display area NA. A distance between the edge of the encapsulation layer and the display area DA may be greater than a distance between the driver circuit area DCR and the display area DA.

The encapsulation layer EN may include one or more inorganic layers and one or more organic layers. As exemplarily illustrated in FIG. 2 to FIG. 4, the encapsulation layer EN may be a thin film encapsulation layer that includes a first inorganic layer 391, an organic layer 392, and a second inorganic layer 393. In the encapsulation layer EN, the first inorganic layer 391 and the second inorganic layer 393 function to prevent permeation of moisture, and the organic layer 392 functions to planarize a surface of the encapsulation layer EN, particularly, the surface of the second inorganic layer 393 in the display area DA. The first inorganic layer 391 and the second inorganic layer 393 may each include an inorganic insulation material such as a silicon oxide, a silicon nitride, and the like. The organic layer 392 may include organic materials such as an acrylic-based resin, a methacryl-based resin, polyisoprene, a vinyl-based resin, an epoxy-based resin, a urethane-based resin, a cellulose-based resin, a perylene-based resin, and/or the like.

The first inorganic layer 391 and the second inorganic layer 393 are each wider than the organic layer 392. The first inorganic layer 391 and the second inorganic layer 393 may contact each other at the periphery of the edge of the encapsulation layer EN. An edge of the first inorganic layer 391 and an edge of the second inorganic layer 393 may substantially correspond to each other. The first inorganic layer 391 may contact the capping layer 371 at the periphery of the encapsulation layer EN. Accordingly, the third insulation layer 181, the capping layer 371, the first inorganic layer 391, and the second inorganic layer 393 are sequentially stacked at the periphery of the encapsulation layer EN such that contact between inorganic layers can be carried out. As described, the first inorganic layer 391 and the second inorganic layer 393 are formed wider such that contact between the inorganic layers is carried out, and accordingly, permeation of moisture or oxygen through the side surface of the display area DA can be more firmly prevented, or a permeation path of moisture or oxygen is made long and complicated to delay the permeation of the moisture or oxygen.

Dams DM1 and DM2 may be disposed in the non-display area NA. The dams DM1 and DM2 may prevent an organic material such as a monomer from running off when the organic layer 392 of the encapsulation layer EN is formed, and accordingly, an edge of the organic layer 392 of the encapsulation layer EN may be disposed inside the dams DM1 and DM2, for example, between the dams DM1 and DM2 and the display area DA. The first inorganic layer 391 and the second inorganic layer 393 of the encapsulation layer EN may extend above the dams DM1 and DM2 such that they may cover the dams DM1 and DM2. In this case, a contact area between the first inorganic layer 391 and the second inorganic layer 393 is increased so that adherence between the first inorganic layer 391 and the second inorganic layer 393 can be increased.

The dams DM1 and DM2 are at least partially overlapped with the gate driver GD in an area where the gate driver GD is located. When the dams DM1 and DM2 are formed as described above, an increase of the non-display area NA can be prevented. Accordingly, a width of the non-display area NA may be reduced, or more wires or elements may be formed in the non-display area NA and a design margin can be increased. For example, the width of the non-display area NA can be reduced to a greater extent that a case that the dams DM and DM2 are formed between the gate driver GD and the display area DA, or a case that the dams DM1 and DM2 are formed at an outer edge then the gate driver GD. Accordingly, a screen ratio of the display device 1 can be increased. As exemplarily illustrated in FIG. 4, the dams DM1 and DM2 may be located in the driver circuit region DCR. Depending on exemplary embodiments, the dams DM1 and DM2 may be located in the driver control line region DSR, or may be located in both of the driver circuit region DCR and the driver control line region DSR.

The dams DM1 and DM2 may include a first dam DM1 that is disposed closer to the display area DA and a second dam DM2 that is disposed farther from the display area DA. The first dam DM1 may at least partially overlap the first static electricity blocking lines EP1, and the second dam DM2 may at least partially overlap the second static electricity blocking lines EP2. For example, the first dam DM1 may at least partially surround the display area DA along the first static electricity blocking lines EP1, and the second dam DM2 may at least partially surround the display area DA along the second static electricity blocking lines EP2.

A width of the first static electricity blocking lines EP1 may be smaller than a width of a bottom surface of the first dam DM1. A width of the second static electricity blocking lines EP2 may be smaller than a width of a bottom surface of the second dam DM2. The first dam DM1 may directly contact, not only a top surface of the first static electricity blocking line EP1, but also a side surface thereof, by wholly covering the first static electricity blocking lines EP1. The bottom surface of the first dam DM1 may directly contact the first static electricity blocking lines EP1 and the third insulation layer 181. The second dam DM2 may directly contact, not only a top surface of the second static electricity blocking lines EP2, but also a side surface thereof, by wholly covering the second static electricity blocking lines EP2. The bottom surface of the second dam DM2 may directly contact the second static electricity blocking lines EP2 and the third insulation layer 181.

The dams DM1 and DM2 may be formed as at least one layer. The dams DM1 and DM2 may be formed by using an insulation layer formed in the display area DA. For example, when the dams DM1 and DM2 are formed as a single layer, the dams DM1 and DM2 may be formed of the same layer as the fourth insulation layer 182 or the same layer as a fifth insulation layer 360. As exemplarily illustrated in FIG. 2 and FIG. 3, when the dams DM1 and DM2 are formed as multiple layers, first layers L11 and L21, which form a lower layer, may be formed of the same layer as the fourth insulation layer 182, and second layers L12 and L22, which form an upper layer, may be formed of the same layer as the fifth insulation layer 360.

Even when the first dam DM1 or the lower layer L11 of the first dam DM1 is formed at the same layer as the fourth insulation layer 182, the first dam DM1 is disposed apart from the fourth insulation layer 182. When the first dam DM1 is adhered to or continuously formed with the fourth insulation layer 182, a space where an organic material that forms the organic layer 392 of the encapsulation layer EN is received cannot be formed before the first dam DM1.

Even when both of the first dam DM1 and the second dam DM2 are formed in multiple layers, the second dam DM2 may be formed higher than the first dam DM1. For example, when the fifth insulation layer 360 and the upper layers L12 and L22 are formed, the upper layer L22 of the second dam DM2 may be formed to be higher than the upper layer L12 of the first dam DM1 by using a halftone mask. According to one exemplary embodiment of the present disclosure, the first dam DM1 and the second dam DM2 may have a substantially equivalent height.

The second electrode E2 of the light emitting element LD extends to an area where the dams DM1 and DM2 are located such that the second electrode E2 of the light emitting element LD may at least partially cover the upper portions of the dams DM1 and DM2 in the non-display area NA. The second electrode E2 may contact upper surfaces and side surfaces of the upper layers L12 and L22 of the dams DM1 and DM2, and may contact side surfaces of the lower layers L11 and L21 of the dams DM1 and DM2.

A mask support MS may be disposed in the non-display area NA. The above-described emission layer EL, the second electrode E2, the capping layer 371, the functional layer 372, and the first and second inorganic layers 391 and 393 of the encapsulation layer EN may be formed through deposition using a metal mask of which an area where the corresponding layer is formed is opened. The mask support MS supports the metal mask. A distance between the mask support MS and the display area DA may be larger than a distance between the dams DM1 and DM2 and the display area DA. The mask support MS may be formed in the same layer as the fourth insulating layer 182 or in the same layer as the fifth insulating layer 360.

The mask support MS may at least partially overlap the third static electricity blocking lines EP3. For example, the mask support MS may at least partially surround the display area DA along the third static electricity blocking lines EP3. A width of the third static electricity blocking lines EP3 may be smaller than a width of a bottom surface of the mask support MS. The mask support MS may directly contact, not only a top surface of the third static electricity blocking lines EP3, but also a side surface thereof by wholly covering the third static electricity blocking lines EP3. A bottom surface of the mask support MS may directly contact the third static electricity blocking lines EP3 and the third insulation layer 181.

The second substrate 210 bonded with the first substrate 110 by the sealant 300 disposed along an edge of the display panel 10 is disposed on the encapsulation layer EN. The second substrate 210 may be shorter than the first substrate 110 in an area where the pad portion PP is located, for example, a lower end of the display panel 10, such that the pad portion PP is exposed to the outside for bonding of a printed circuit film.

The sealant 300 is formed to wholly surround the display area DA. The sealant 300 bonds the first substrate 110 and the second substrate 210, and prevents an impurity such as moisture, oxygen, and the like from permeating between the first substrate 110 and the second substrate 210 from the outside. Thus, the display area DA can be sealed air-tight by a combination of the first substrate 110, the second substrate 210, and the sealant 300 therebetween. A sealing material is coated on the first substrate 110 and/or the second substrate 210, and the first substrate 110 and the second substrate 210 are placed facing each other with the sealing material between the first substrate 110 and the second substrate 210, and then position where the sealing material is coated is irradiated with a laser beam such that the sealant 300 can be formed. The coated sealing material may be a frit, for example, a glass frit. When the sealing material is irradiated with the laser beam and then heated, the sealing material is melted and thus the sealing material bonds to the first substrate 110 and the second substrate 210 like an adhesive. The sealing material so-bonded to the first substrate 110 and the second substrate 210 is then cured, and thus the sealant 300 that forms an air-tight bond between the first substrate 110 and the second substrate 210 can be formed. As described above, the display area DA is also sealed by the encapsulation layer EN, and accordingly the display area DA can be double-sealed.

The sealant 300 may overlap at least a part of the gate driver GD, particularly, the driver control line region DSR. As described, when the sealant 300 and the driver circuit DC overlap each other, at least in part, the area of the non-display area NA at the left and right of the display area DA can be reduced, thereby reducing a left and right bezel width of the display device 1.

The second substrate 210 may be formed of a transparent and rigid material such as glass, quartz, ceramic, and/or the like. The second substrate 210 may be spaced apart from the encapsulation layer EN by a predetermined distance.

A light blocking member 220 and color filters 230R, 230G, and 230B may be disposed on a surface of the second substrate 210 which faces the first substrate 110. The color filters 230R, 230G, and 230B may include a red color filter 230R, a green color filter 230G, and a blue color filter 230B, respectively. The capping layer may be disposed on the color filters 230R, 230G, and 230B.

The light blocking member 220 is formed in an area substantially excluding a pixel area (e.g., an area overlapping the emission layer EL), and the light blocking member 220 prevents light transmission in the area excluding the pixel area. The light blocking member 220 may be disposed between the red color filter 230R and the green color filter 230G, between the green color filter 230G and the blue color filter 230B, and between the blue color filter 230B and the red color filter 230R. The light blocking members 220 may partition areas where the red color filter 230R, the green color filter 230G, and the blue color filter 230B are disposed.

When the light emitting element LD is configured to emit blue light, the red color filter 230R converts blue light to red light, the green color filter 230G converts blue light to green light, and the blue color filter 230B directly transmits the blue light. Thus, the red color filter 230R and the green color filter 230G may be referred to as color conversion layers, and the blue color filter 230B may be referred to as a transmissive layer. The red color filter 230R may include quantum dots and/or phosphor that convert blue light to red light. The green color filter 230G may include quantum dots and/or a phosphor that converts blue light to green light. The blue color filter 230B may include a resin that transmits light, and may further include a dye or a pigment. A blue light cutting filter (e.g., a yellow color filter) than transmits a wavelength excluding a blue wavelength band, and blocks the blue wavelength band, may be disposed between the red color filter 230R and the second substrate 210 and between the green color filter 230G and the second substrate 210.

A touch sensor layer that includes touch electrodes for sensing a touch (such as a contact touch or a non-contact touch) may be disposed on the second substrate 210, and a polarization layer may be disposed on the second substrate 210 to reduce reflection of external light.

Figure 6:
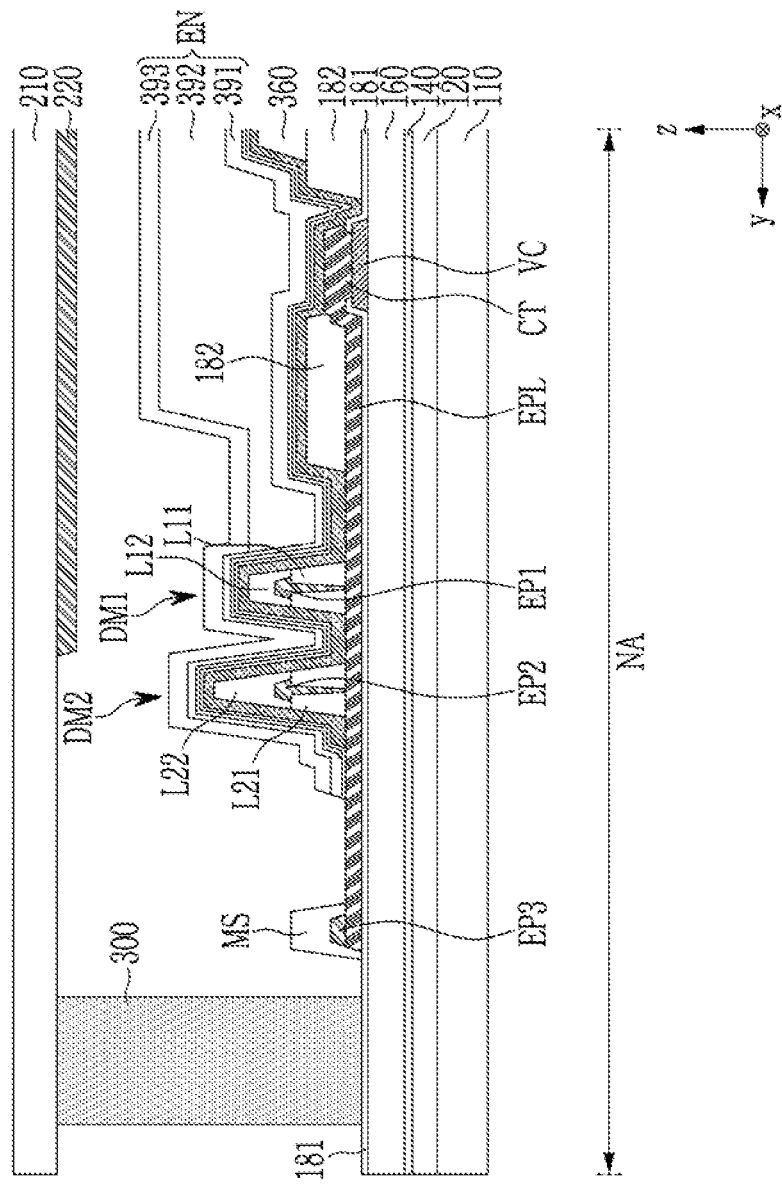
FIG. 6 is a schematic cross-sectional view illustrating an exemplary embodiment of FIG. 1, taken along the line A"-A'"
Figure 7:
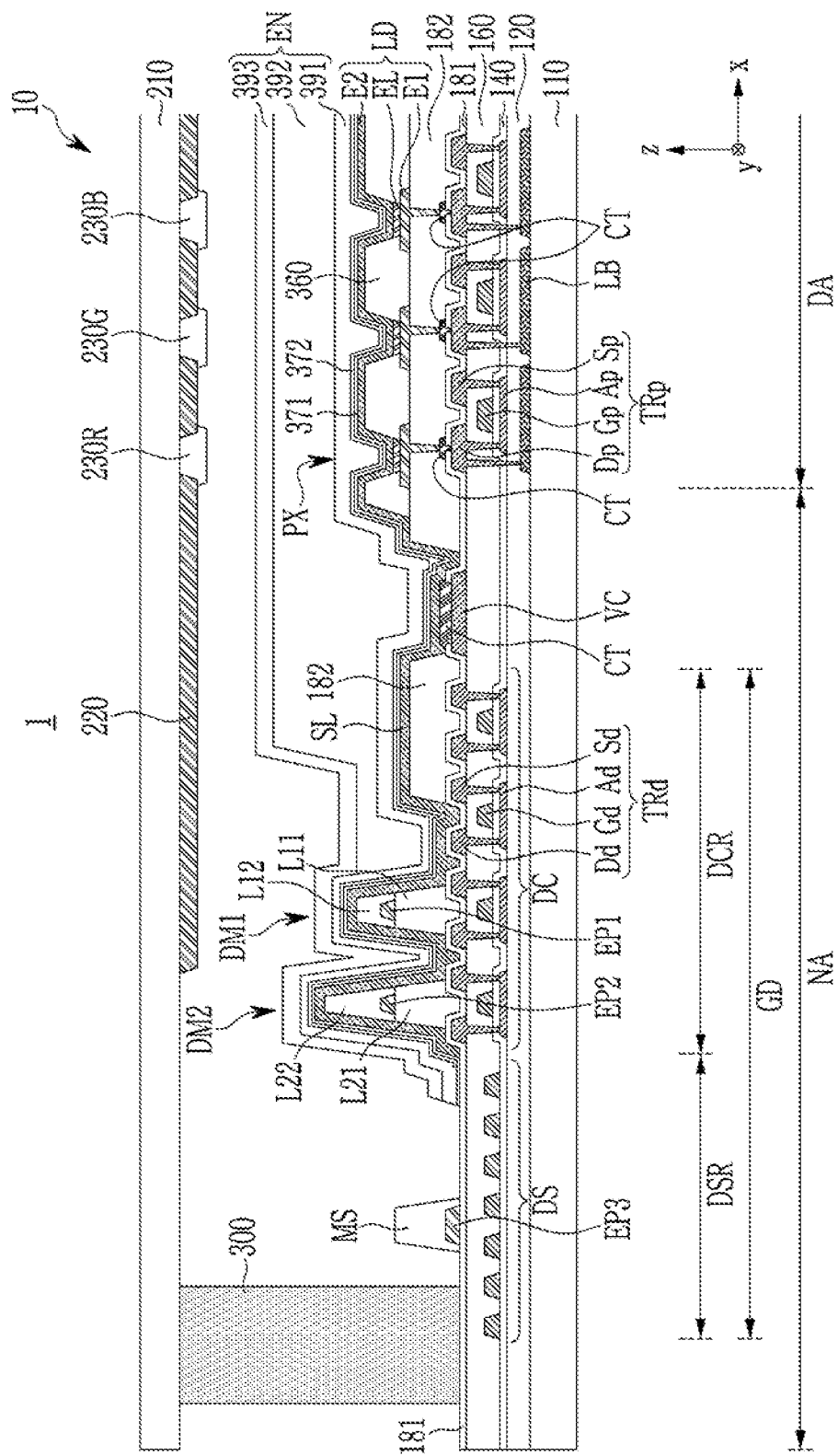
FIG. 7 is a schematic cross-sectional view illustrating an exemplary embodiment of FIG. 1, taken along the line B-B'.

Hereinafter, an exemplary embodiment of the cross-sectional structure of the display panel will be described with reference to FIG. 5 to FIG. 7, together with FIG. 1. Difference between the above-described exemplary embodiment of FIG. 1 to FIG. 4 will be mainly described. To the extent that a detailed description of elements is omitted, it may be assumed that those elements are at least similar to corresponding elements that are described elsewhere in the present disclosure.

Figure 5:
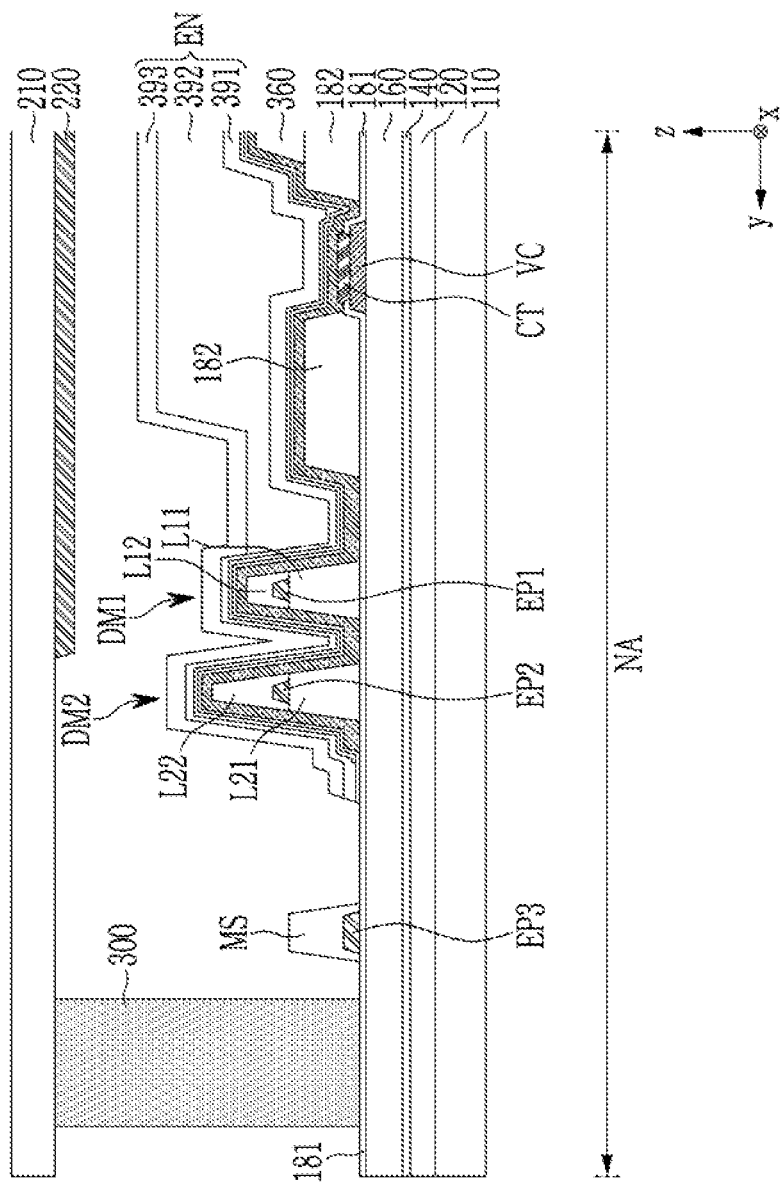
FIG. 5 is a schematic cross-sectional view illustrating an exemplary embodiment of FIG. 1, taken along the line A-A'.

FIG. 5 is a schematic cross-sectional view illustrating an exemplary embodiment of FIG. 1, taken along the line A-A'. FIG. 6 is a schematic cross-sectional view illustrating an exemplary embodiment of FIG. 1, taken along the line A"A'". FIG. 7 is a schematic cross-sectional view illustrating an exemplary embodiment of FIG. 1, taken along the line B-B'.

The first to third static electricity blocking lines EP1, EP2, and EP3 might not be at the same layer as the contact layer CT but may be at the same layer as the first electrode E1 of the light emitting element LD. For example, the first to third static electricity blocking lines EP1, EP2, and EP3 may be formed of the same material through the same process as the first electrode E1 of the light emitting element LD.

The first static electricity blocking lines EP1 may be disposed between the lower layer L11 and the upper layer L12 of the first dam DM1, and the second static electricity blocking lines EP2 may be disposed between the lower layer L21 and the upper layer L22 of the second dam DM2. A width of the first static electricity blocking lines EP1 may be smaller than a width of a bottom surface of the upper layer L12. The upper layer L12 of the first dam DM1 may directly contact not only the top surface of the first static electricity blocking lines EP1, but also a side surface thereof by wholly covering the first static electricity blocking lines EPL. A width of the second static electricity blocking lines EP2 may be smaller than a width of a bottom surface of the upper layer L22 of the second dam DM2. The upper layer L22 of the second dam DM2 wholly covers the second static electricity blocking lines EP2 such that the upper layer L22 not only directly contacts an upper surface of the second static electricity blocking lines EP2 but also directly contacts a side surface thereof.

The mask support MS is formed at the same layer as the fifth insulation layer 360, and may wholly cover the third static electricity blocking lines EP3, which are at the same layer as the first electrode E1 of the light emitting element LD.

The connection line EPL may extend to the third static electricity blocking lines EP3 from the contact layer CT on the common voltage line VC. The first static electricity blocking lines EP1 and the second static electricity blocking lines EP2 may be respectively connected with the connection line EPL through a contact hole formed in the lower layer L11 of the first dam DM1 and a contact hole formed in the lower layer L21 of the second dam DM2.

Excluding such a difference, the features of the exemplary embodiments described with reference to FIG. 1 to FIG. 4 are applicable to an exemplary embodiment described with reference to FIG. 5 to FIG. 7, and accordingly, the redundant feature of the exemplary embodiment described with reference to FIG. 1 to FIG. 4 will not be described and should be assumed to be at least similar to that of corresponding elements described elsewhere in the specification.

Figure 9:
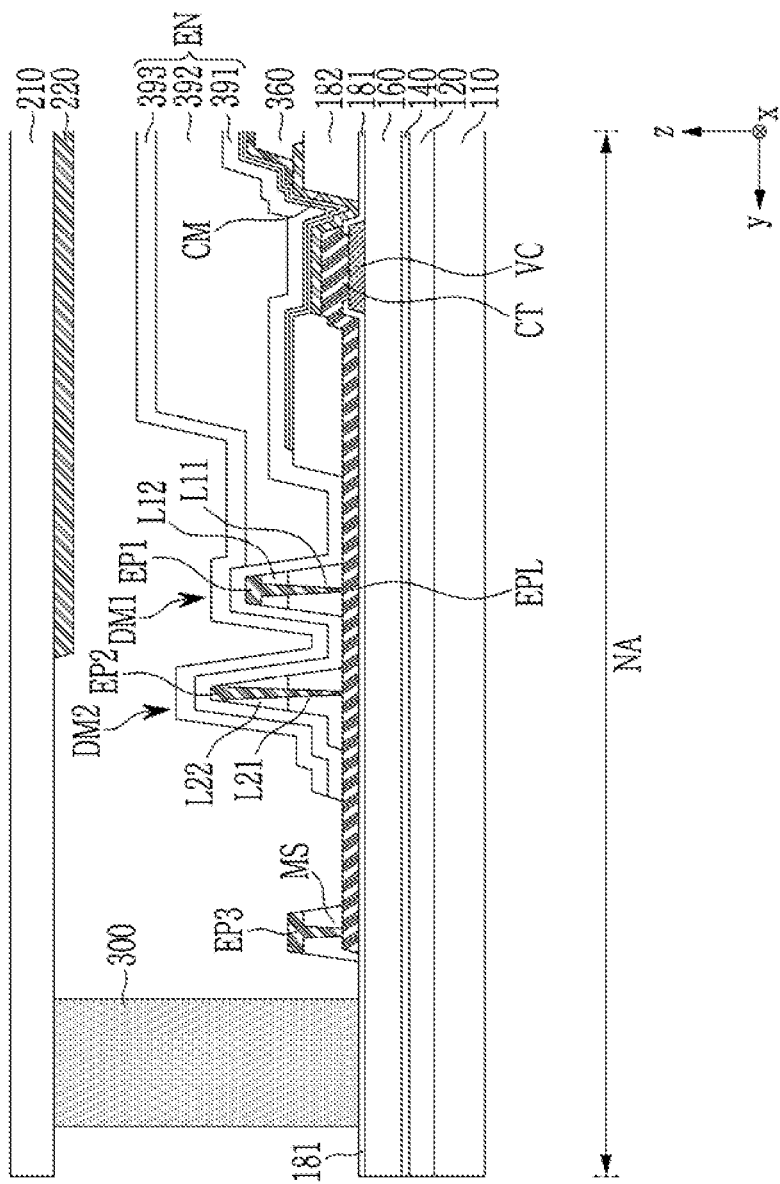
FIG. 9 is a schematic cross-sectional view illustrating an exemplary embodiment of FIG. 1, taken along the line A"-A'"
Figure 10:
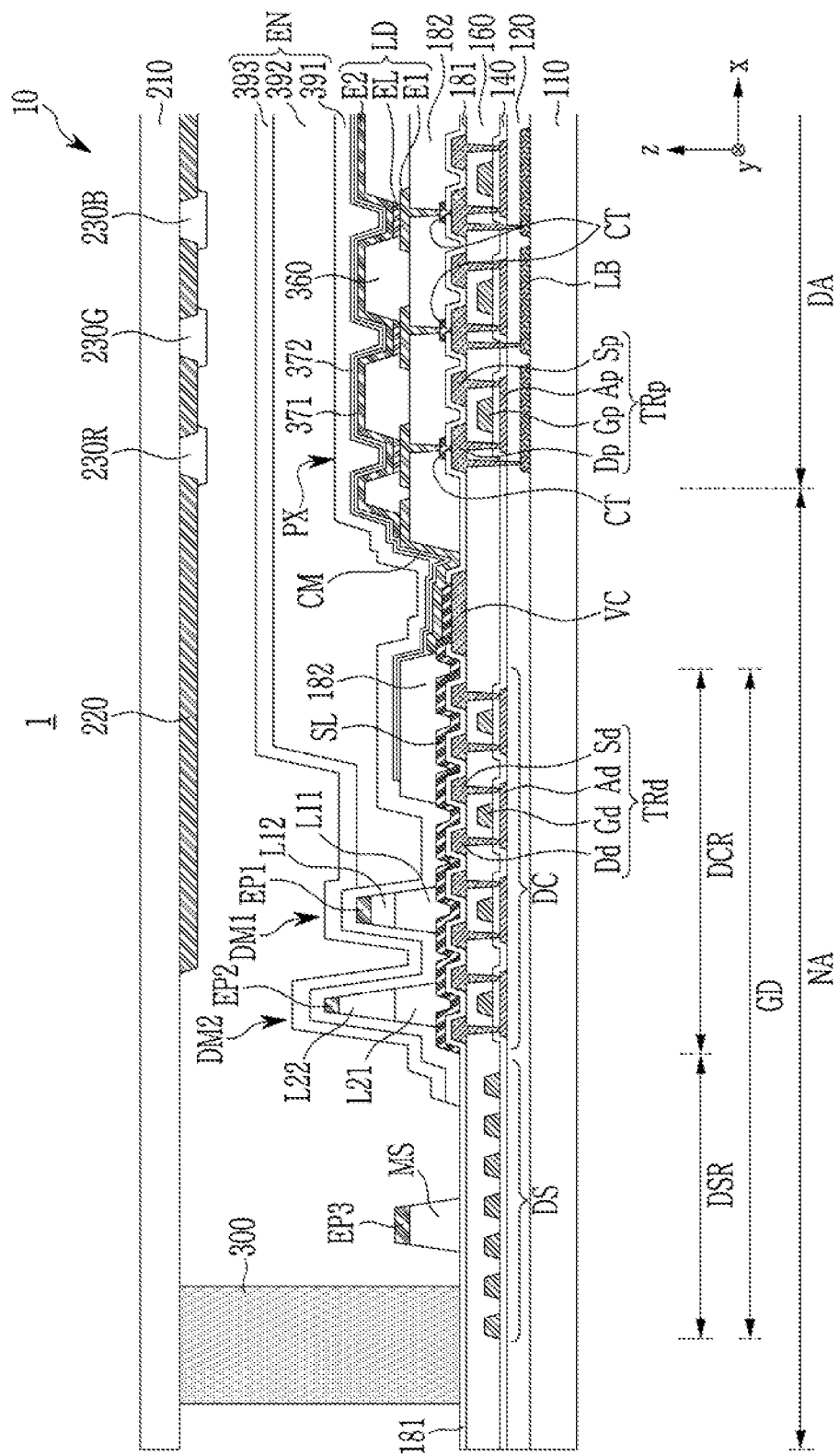
FIG. 10 is a schematic cross-sectional view illustrating an exemplary embodiment of FIG. 1, taken along the line B-B'.

Hereinafter, an exemplary embodiment of a cross-sectional structure of the display panel 10 will be described with reference to FIG. 8 to FIG. 10, together with FIG. 1. Differences between what is described herein with respect to FIG. 1 to FIG. 4 will mainly be described and it should be assumed that elements that are not described in detail are at least similar to corresponding elements described elsewhere in the specification.

Figure 8:
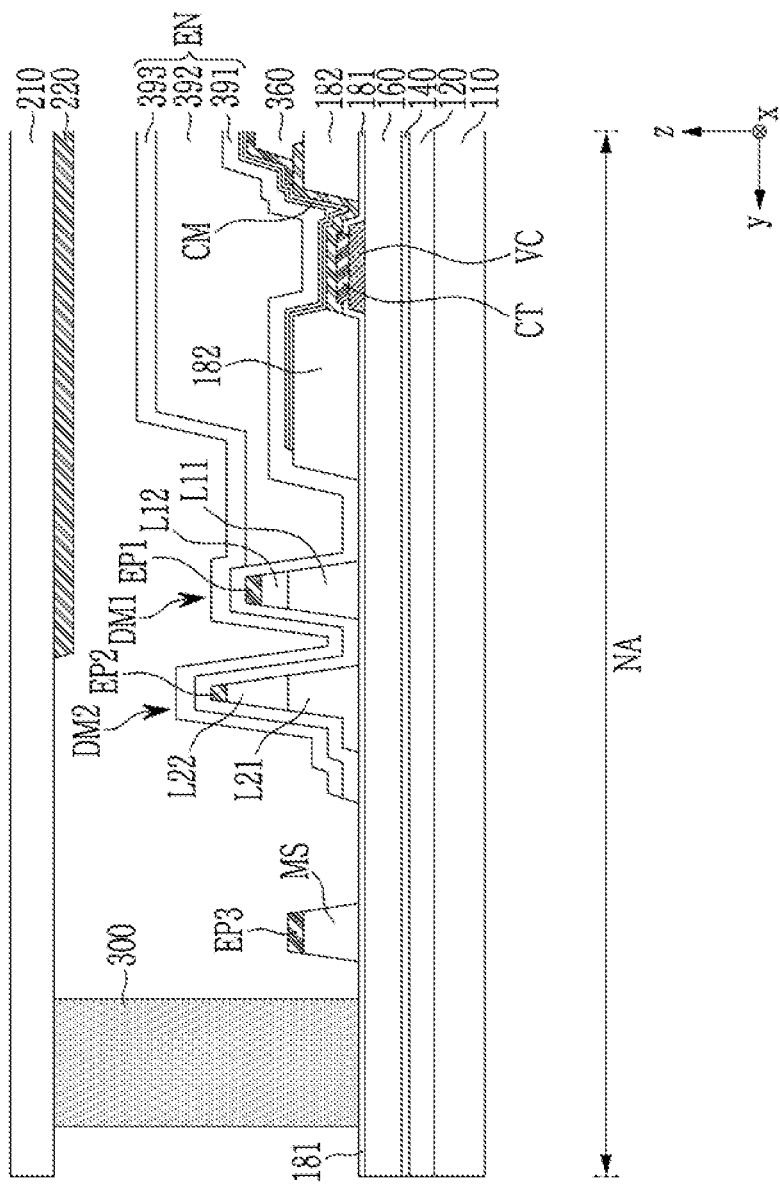
FIG. 8 is a schematic cross-sectional view illustrating an exemplary embodiment of FIG. 1, taken along the line A-A'.

FIG. 8 is a schematic cross-sectional view illustrating an exemplary embodiment of FIG. 1, taken along the line A-A'. FIG. 9 is a schematic cross-sectional view illustrating an exemplary embodiment of FIG. 1, taken along the line A"-A". FIG. 10 is a schematic cross-sectional view illustrating an exemplary embodiment of FIG. 1, taken along the line B-B'.

The first to third static electricity blocking lines EP1, EP2, and EP3 might not be at the same layer as the contact layer CT, but may be at the same layer as the second electrode E2 of the light emitting element LD. For example, the first to third static electricity blocking lines EP1, EP2, and EP3 may be formed of the same material through the same process as the second electrode E2 of the light emitting element LD.

The second electrode E2 of the light emitting element LD is not directly connected with any of the first to third static electricity blocking lines EP1, EP2, and EP3, and the second electrode E2 is connected with a connection member CM. The connection member CM is disposed on the fourth insulation layer 182, and may be electrically connected with the common voltage line VC through the contact layer CT. For this, the third insulation layer 181 and the fourth insulation layer 182 that overlap the common voltage line VC may be partially removed. Since the connection member CM is connected with the common voltage line VC, the second electrode E2 may be electrically connected with the common voltage line VC through the connection member CM. The connection member CM may be at the same layer as the first electrode E1 of the light emitting element LD.

The first static electricity blocking lines EP1 may be disposed above the first dam DM1. The first static electricity blocking lines EP1 may be disposed above the upper layer 112 of the first dam DM1. For example, the first static electricity blocking lines EP1 may contact the top surface of the upper layer L12 of the first dam DM1.

The second static electricity blocking lines EP2 may be disposed above the second dam DM2. The second static electricity blocking lines EP2 may be disposed above the upper layer L22 of the second dam DM2. For example, the second static electricity blocking lines EP2 may contact the upper surface of the upper layer L12 of the second dam DM2.

The third static electricity blocking lines EP3 may be disposed above the mask support MS. The mask support MS may be formed at the same layer as the fourth insulation layer 182 or the fifth insulation layer 360.

The connection line EPL may extend to the third static electricity blocking lines EP3 from the contact layer CT on the common voltage line VC. The first static electricity blocking lines EP1 and the second static electricity blocking lines EP2 may be respectively connected to the connection line EPL through a contact hole formed in the lower layer L11 and the upper layer L12 of the first dam DM1 and the lower layer L21 and the upper layer L22 of the second dam DM2. The third static electricity blocking lines EP3 may be connected to the connection line EPL through a contact hole formed in the mask support MS.

In an area where the gate driver GD is located, a shielding layer SL may be disposed between the third insulation layer 181 and the fourth insulation layer 182. The shielding layer SL may be disposed between the third insulation layer 181 and the dams DM1 and DM2, and may receive the common voltage ELVSS by contacting the contact layer CT on the common voltage line VC. The shielding layer SL may be at the same layer as the contact layer CT.

Excluding such a difference, the features of the exemplary embodiments described with reference to FIG. 1 to FIG. 4 are applicable to an exemplary embodiment described with reference to FIG. 8 to FIG. 10, and accordingly, the redundant feature of the exemplary embodiment described with reference to FIG. 1 to FIG. 4 will not be described and it should be assumed that those elements not described are at least similar to corresponding elements described elsewhere in the specification.

Figure 12:
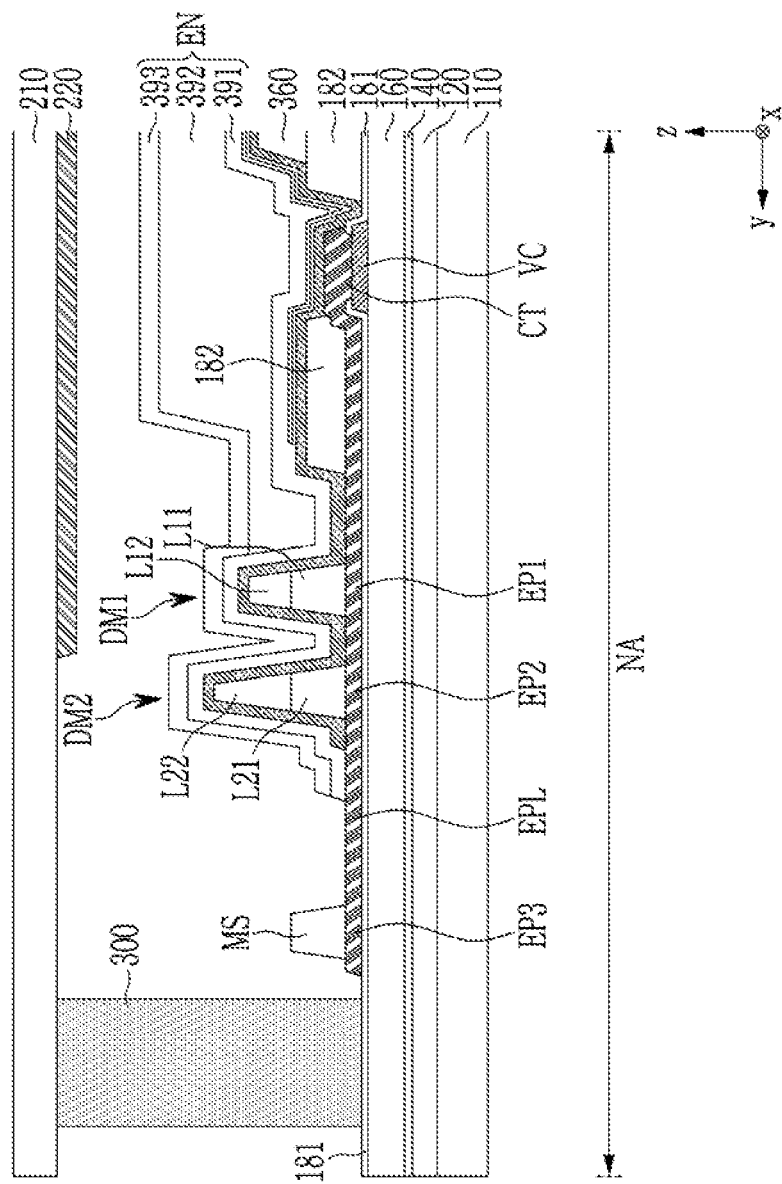
FIG. 12 is a schematic cross-sectional view illustrating an exemplary embodiment of FIG. 1, taken along the line A"-A'"
Figure 13:
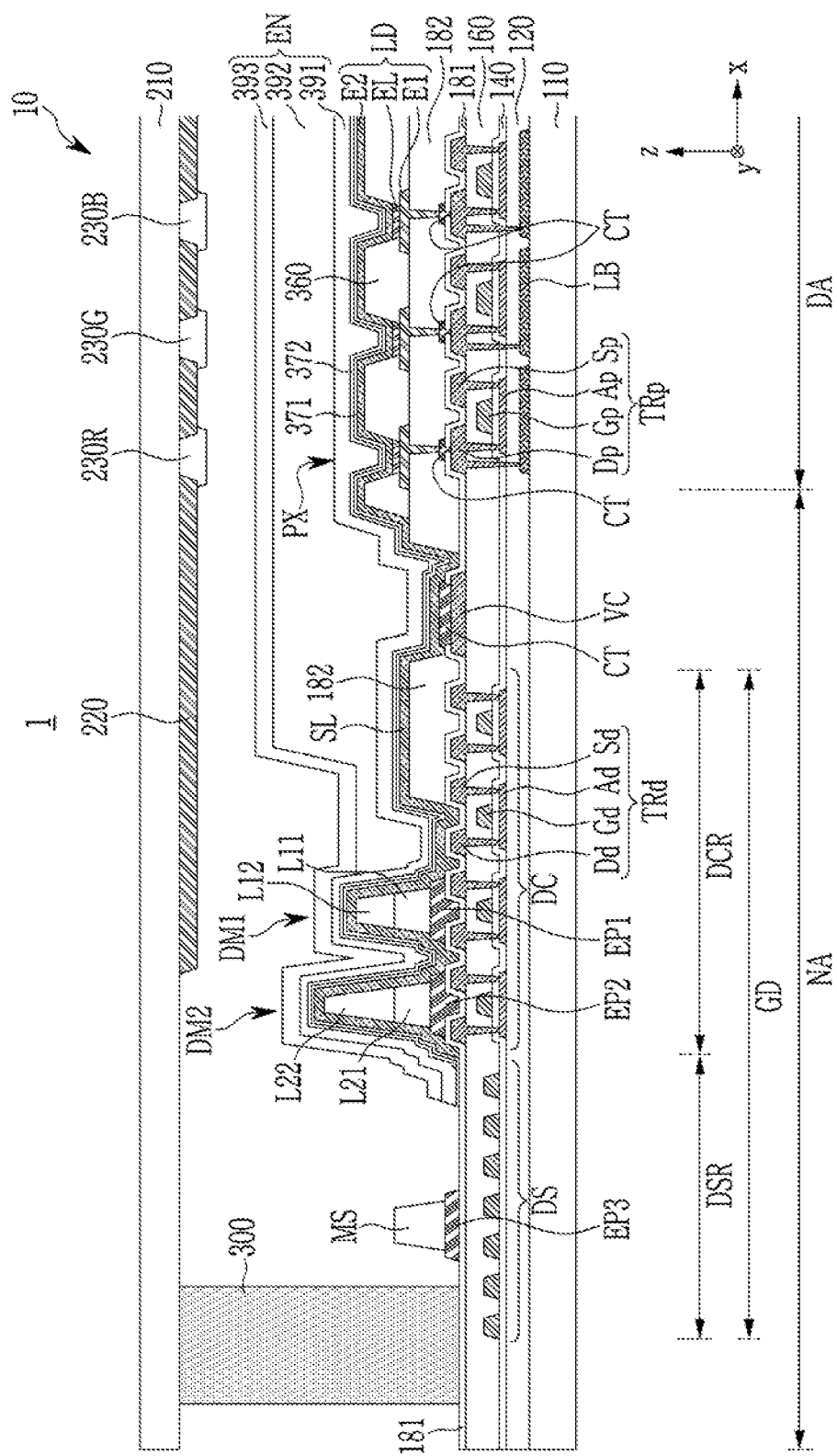
FIG. 13 is a schematic cross-sectional view illustrating an exemplary embodiment of FIG. 1, taken along the line B-B'.

Hereinafter, an exemplary embodiment of the present invention, will be described with respect to the cross-sectional structure of the display panel illustrated in FIG. 11 to FIG. 13, together with FIG. 1. Differences between what is described herein with respect to FIG. 1 to FIG. 4 will mainly be described.

Figure 11:
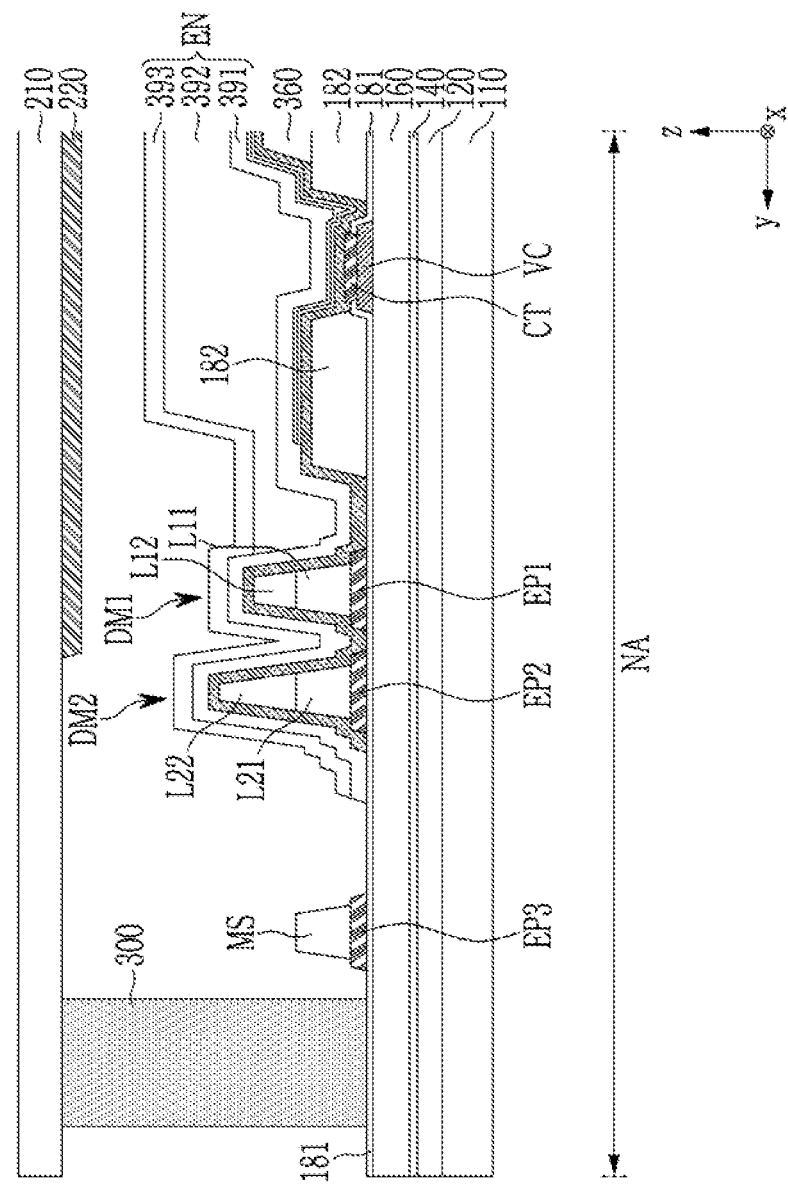
FIG. 11 is a schematic cross-sectional view illustrating an exemplary embodiment of FIG. 1, taken along the line A-A'.

FIG. 11 is a schematic cross-sectional view illustrating an exemplary embodiment of FIG. 1, taken along the line A-A'. FIG. 12 is a schematic cross-sectional view illustrating an exemplary embodiment of FIG. 1, taken along the line A"A'". FIG. 13 is a schematic cross-sectional view of an exemplary embodiment of FIG. 1, taken along the line B-B'.

A width of the first static electricity blocking lines EP1 is larger than a width of the bottom surface of the first dam DM1, a width of the second static electricity blocking lines EP2 is larger than a width of the bottom surface of the second dam DM2, and a width of the third static electricity blocking lines EP3 is larger than a width of the bottom surface of the mask support MS. For example, the first dam DM1 partially covers the first static electricity blocking lines EP1, the second dam DM2 partially covers the second static electricity blocking lines EP2, and the mask support MS partially covers the third static electricity blocking lines EP3. For example, the first dam DM1 covers about 80% of the top surface of the first static electricity blocking lines EP1, the second dam DM2 covers about 80% of the top surface of the second static electricity blocking lines EP2, and the mask support MS covers about 80% of the top surface of the third static electricity blocking lines EP3.

Since the width of the first static electricity blocking lines EP1 is larger than that of the bottom surface of the first dam DM1, the second electrode E2 of the light emitting element LD that covers the first dam DM1, and the first static electricity blocking lines EP1, may contact each other. In addition, since the width of the second static electricity blocking lines EP2 is larger than the width of the bottom surface of the second dam DM2, the second electrode E2 of the light emitting element LD that covers the second dam DM2, and the second static electricity blocking lines EP2, may contact each other.

Excluding such a difference, the features of the exemplary embodiments described with reference to FIG. 1 to FIG. 4 are applicable to an exemplary embodiment described with reference to FIG. 11 to FIG. 13, and accordingly, the redundant feature of the exemplary embodiment described with reference to FIG. 1 to FIG. 4 will not be described and it should be assumed that those elements not described are at least similar to corresponding elements described elsewhere in the specification.

In the above example, the dams DM1 and DM2 are located in the driver circuit region DCR in the area where the gate driver GD is located, but the dams DM1 and DM2 may be located in the driver control line region DSR.

Hereinafter, exemplary embodiments in which the dams DM1 and DM2 are disposed in the driver control line region DSR in the area where the gate driver GD is located will be described with reference to FIG. 14 to FIG. 16. Differences between what is described herein with respect to FIG. 4 will mainly be described and it should be assumed that elements that are not described in detail are at least similar to corresponding elements described elsewhere in the specification.

Figure 14:
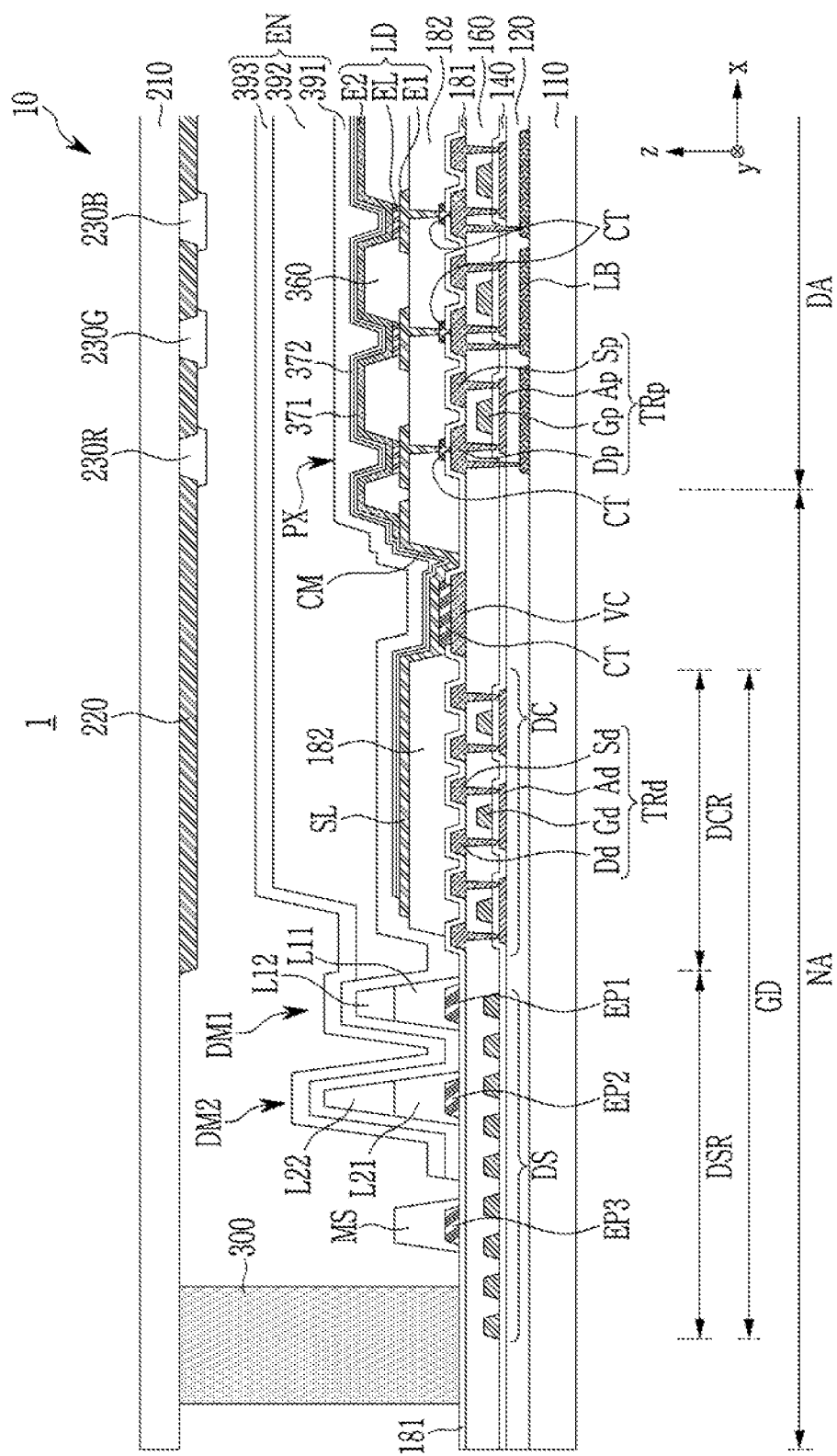
FIG. 14 is a schematic cross-sectional view illustrating an exemplary embodiment of FIG. 1, taken along the line B-B'.

FIG. 14 is a schematic cross-sectional view illustrating an exemplary embodiment of FIG. 1, taken along the line B-B'.

Referring to FIG. 14, a connection member CM that contacts the contact layer CT on the common voltage line VC and is connected thereto may be disposed on the fourth insulation layer 182.

The fourth insulation layer 182 is formed to cover at least a part of the driver circuit DC, and the shielding layer SL that overlaps the driver circuit CD may be disposed on the fourth insulation layer 182. The shielding layer SL may shield the driver circuit DC to prevent the driver circuit DC from being damaged by static electricity during a manufacturing process of the display device 1 or in the handling of the display device 1. The shielding layer SL may cover at least a part of the driver circuit DC, almost all of the driver circuit DC, or the entire driver circuit DC. The shielding layer SL may extend primarily in the second direction y as the driver circuit DC is disposed. The shielding layer SL may be electrically and physically connected with the connection member CM, and may be electrically connected to the common voltage line VC through the connection member CM and the contact layer CT. The shielding layer SL and the connection member CM, which is a conductive layer, may be at the same layer as the first electrode E1. For example, the shielding layer SL and the connection member CM may be formed of the same material through the same process as the first electrode E1.

The second electrode E2 is connected with the connection member CM. Since the connection member CM is electrically connected with the common voltage line VC, the second electrode E2 may be electrically connected to the common voltage line VC through the connection member CM. Thus, when the common voltage line VC transmits the common voltage ELVSS, the second electrode E2 may receive the common voltage ELVSS.

The capping layer 371 and the functional layer 372 may be substantially formed at the shielding layer SL. The capping layer 371 and the functional layer 372 may cover a part of the shielding layer SL, or may wholly cover the shielding layer SL. A bottom surface of the capping layer 371 may contact a top surface of the shielding layer SL.

The dams DM1 and DM2 are disposed in the driver control line region DSR, and might not be located in the driver circuit region DCR. In addition, the first to third static electricity blocking lines EP1, EP2, and EP3 are also located in the driver control line region DSR.

Excluding such a difference, the features of the exemplary embodiments described with reference to FIG. 1 to FIG. 4 are applicable to an exemplary embodiment described with reference to FIG. 14, and accordingly, the redundant feature of the exemplary embodiment described with reference to FIG. 1 to FIG. 4 will not be described and it should be assumed that those elements not described are at least similar to corresponding elements described elsewhere in the specification.

Figure 15:
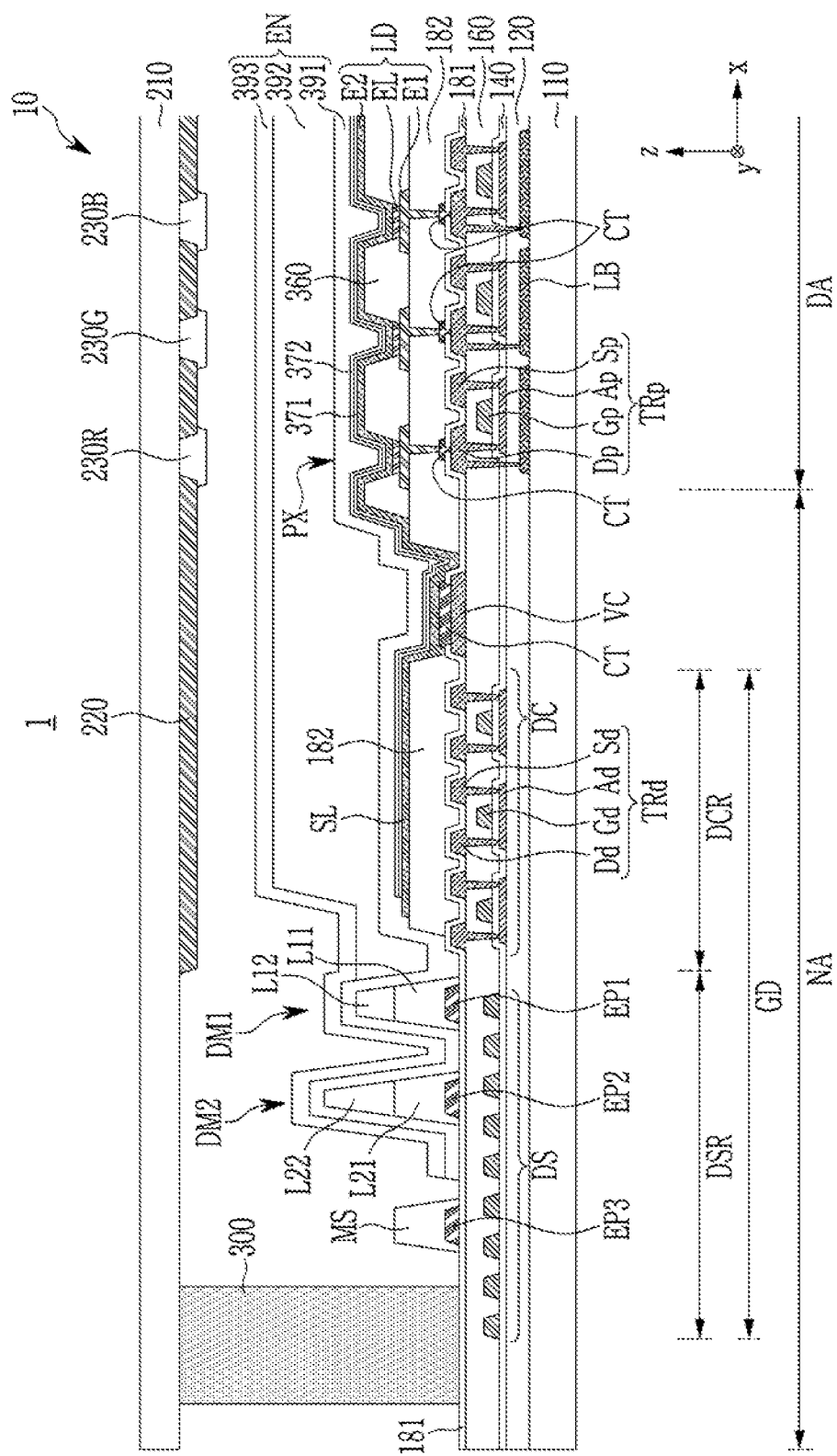
FIG. 15 is a schematic cross-sectional view illustrating an exemplary embodiment of FIG. 1, taken along the line B-B'.

FIG. 15 is a schematic cross-sectional view illustrating an exemplary embodiment of FIG. 1, taken along the line B-B'.

Referring to FIG. 15, unlike the exemplary embodiment of FIG. 14, the display panel 10 might not include the connection member CM that electrically connects the second electrode E2 with the common voltage line VC, and the second electrode E2 may be connected to the contact layer CT on the common voltage line VC by directly contacting the contact layer CT. In addition, the shielding layer SL may be formed by an extension portion of the second electrode E2. For example, the shielding layer SL overlapping the driver circuit DC may be formed of the same material through the same process as the second electrode E2.

Excluding such a difference, the features of the exemplary embodiments described with reference to FIG. 1 to FIG. 4 are applicable to an exemplary embodiment described with reference to FIG. 15, and accordingly, the redundant feature of the exemplary embodiment described with reference to FIG. 1 to FIG. 4 will not be described and it should be assumed that those elements not described are at least similar to corresponding elements described elsewhere in the specification.

Figure 16:
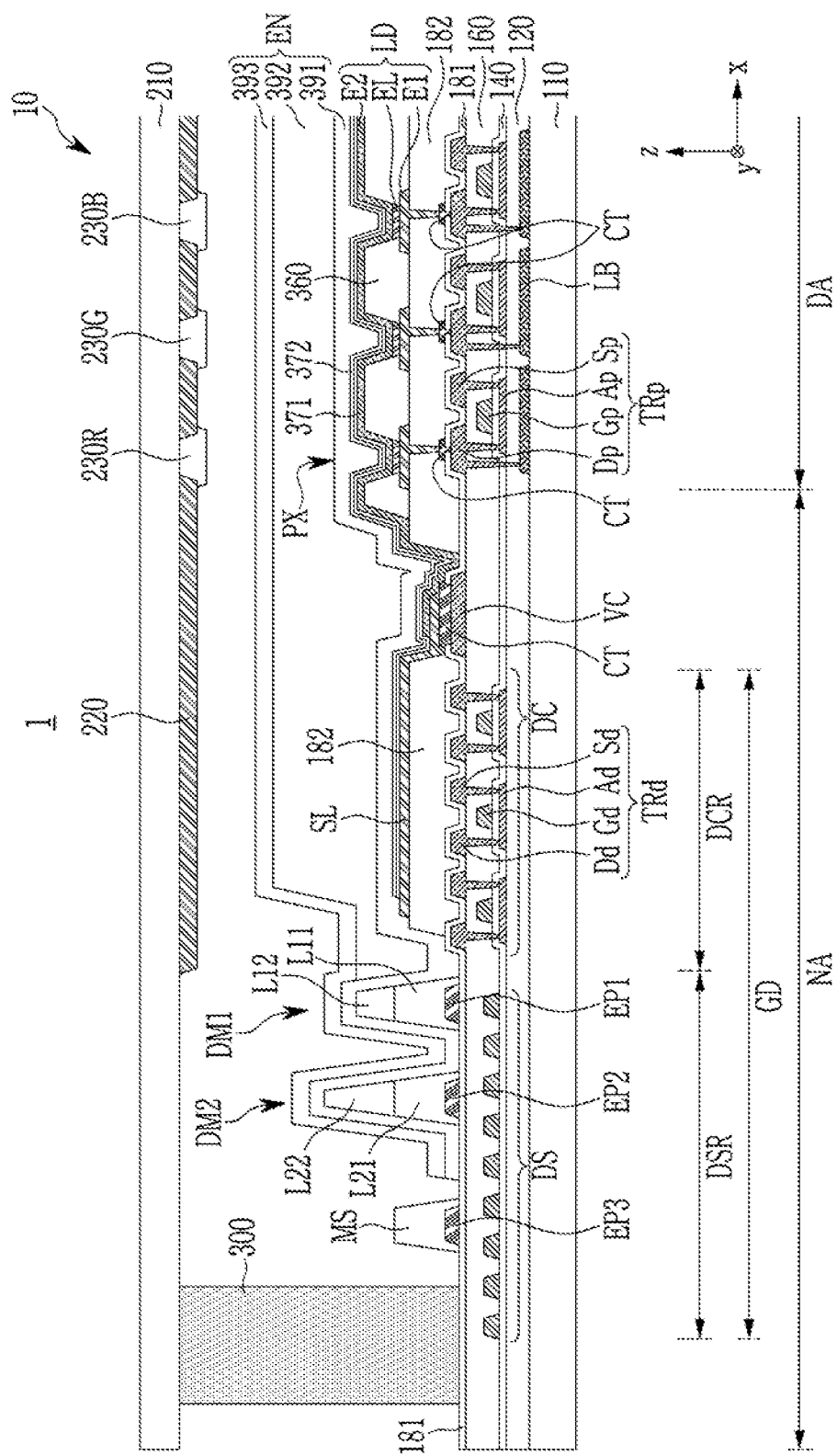
FIG. 16 is a schematic cross-sectional view illustrating an exemplary embodiment of FIG. 1, taken along the line B-B'.

FIG. 16 is a schematic cross-sectional view illustrating an exemplary embodiment of FIG. 1, taken along the line B-B'.

Referring to FIG. 16, unlike the exemplary embodiment of FIG. 14, the shielding layer SL which may be formed at the same layer as the first electrode E may contact the contact layer CT on the common voltage line VC. Thus, the shielding layer SL may receive the common voltage ELVSS through the contact layer CT. The display panel 10 does not include the connection member CM that electrically connects the second electrode E2 to the common voltage line VC, and the second electrode E2 may be electrically connected to the common voltage line VC through the shielding layer SL and the contact layer CT.

Excluding such a difference, the features of the exemplary embodiments described with reference to FIG. 1 to FIG. 4 and FIG. 14 are applicable to an exemplary embodiment described with reference to FIG. 16, and accordingly, the redundant feature of the exemplary embodiment described with reference to FIG. 1 to FIG. 4 and FIG. 14 will not be described and it should be assumed that those elements not described are at least similar to corresponding elements described elsewhere in the specification.

Hereinafter, referring to FIG. 17, a structure of a pad in the pad portion of the display device 1 will be described, focusing on a layer relationship with pixels disposed in the display area DA. To avoid excess complexity of description, the display area DA is only shown from the first substrate 110 to light emitting element LD.

Figure 17:
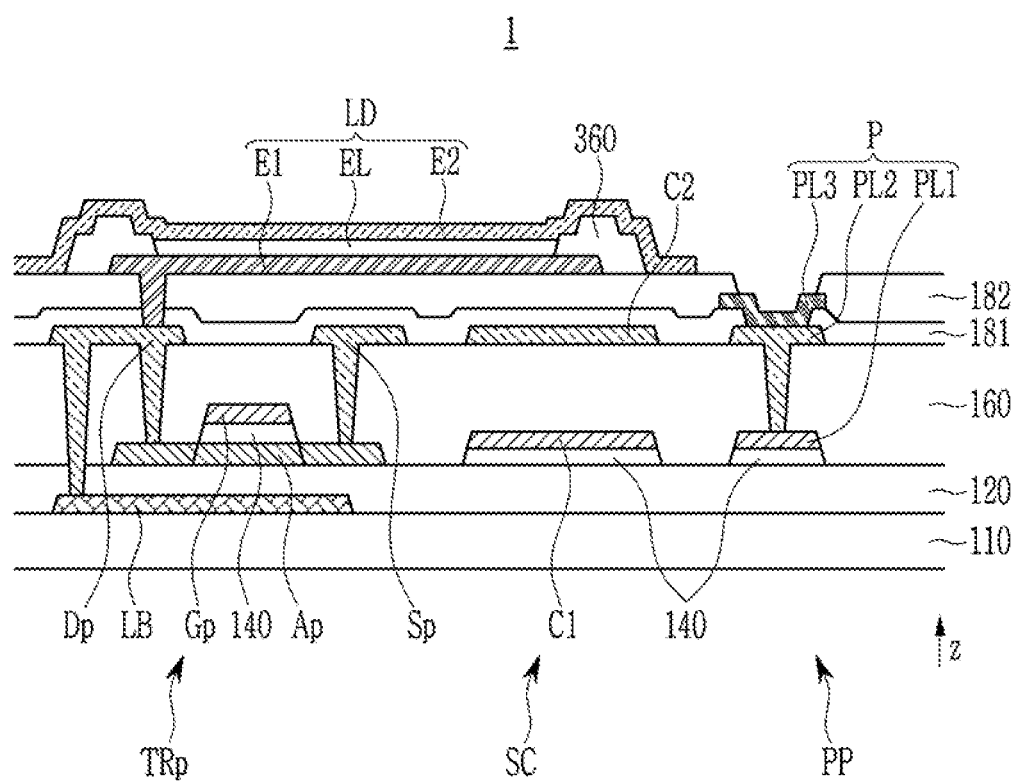
FIG. 17 is a schematic cross-sectional view illustrating a display device according to an exemplary embodiment of the present invention.

FIG. 17 is a schematic cross-sectional view illustrating a display device according to an exemplary embodiment of the present invention.

Referring to FIG. 17, a pad P is disposed in a pad portion PP. The pad P may be formed of a plurality of layers PL1, PL2, and PL3. For example, the pad P includes the first layer PL1 that may be formed of the same material through the same process as a gate electrode Gp of a transistor TRp, the second layer PL2 that may be formed of the same material through the same process as a source electrode Sp and a drain electrode Dp of the transistor TRp, and the third layer PL3 disposed on the second layer PL2. The three layers PL1, PL2, and P13 are illustrated as layers for forming the pad P, but the pad P may include less than three or more than three layers.

The first layer PL1 may be connected with a wire disposed in a non-display area NA of a display panel 10, and a part of the wire may form the first layer PL1. The second layer PL2 may be connected with the first layer PL1 through a contact hole formed in the second insulation layer 160, and the third layer PL3 may be connected to the second layer P12 through a contact hole formed in the third insulation layer 181. Thus, a signal input to the third layer PL3 may be transmitted to the wire through the second layer PL2 and the first layer PL1.

Even when the second layer PL2, which is a data conductor, is formed of a single copper (Cu) layer or a multiple (e.g., Ti/Cu) layer, the second layer PL2 may be oxidized by being exposed to the outside when the topmost layer is formed of copper (Cu). Thus, the third layer PL3 may be formed on the second layer PL2 to prevent the second layer PL2 from being exposed, to thereby prevent oxidation of the second layer PL2. The third layer PL3 may be formed of a transparent conductive oxide, such as ITO, IZO, and the like. In addition to the transparent conductive oxide, the third layer PL3 may be formed of a conductor having excellent oxidation resistance and corrosion resistance. The third layer PL3 is the uppermost layer of the pad P, which is electrically connected to a pad such as a flexible printed circuit film through an anisotropically conductive layer, a solder, or the like, and may be referred to as a pad terminal. The third layer PL3 may be disposed between a third insulation layer 181 and a fourth insulation layer 182, and the fourth insulation layer 182 may cover an edge of the third layer PL3. According to one exemplary embodiment of the present disclosure, any part of the third layer PL3 might not be covered by the fourth insulation layer 182.

The above-described contact layer CT and the connection line EPL may be at the same layer as the third layer PL3. For example, the contact layer CT and the connection line EPL may be formed of the same material through the same process as the third layer PL3. In addition, the first to third static electricity blocking lines EP1, EP2, and EP3 described with reference to FIG. 2 to FIG. 4 may be at the same layer as the third layer PL3.

A first electrode C1 among two electrodes C1 and C2 of a storage capacitor (refer to SC in FIG. 18) included in the pixel PX may be formed at the same layer as the gate electrode Gp of the transistor TRp. A second electrode C2 overlapping the first electrode C1 may be formed at the same layer as the source electrode Sp and the drain electrode Dp of the transistor TRp. The first electrode C1 may be electrically connected with the gate electrode Gp, and the second electrode C2 may be electrically connected with the drain electrode Dp. Meanwhile, unlike the above-described exemplary embodiments, in FIG. 17, the first insulation layer 140 is not entirely formed, and is formed only in an area overlapping the gate conductor. Such a structure may be a result of patterning the first insulation layer 140 together when patterning the gate conductor.

Hereinafter, a pixel, according to an exemplary embodiment of the present invention, will be described with reference to FIG. 18.

Figure 18:
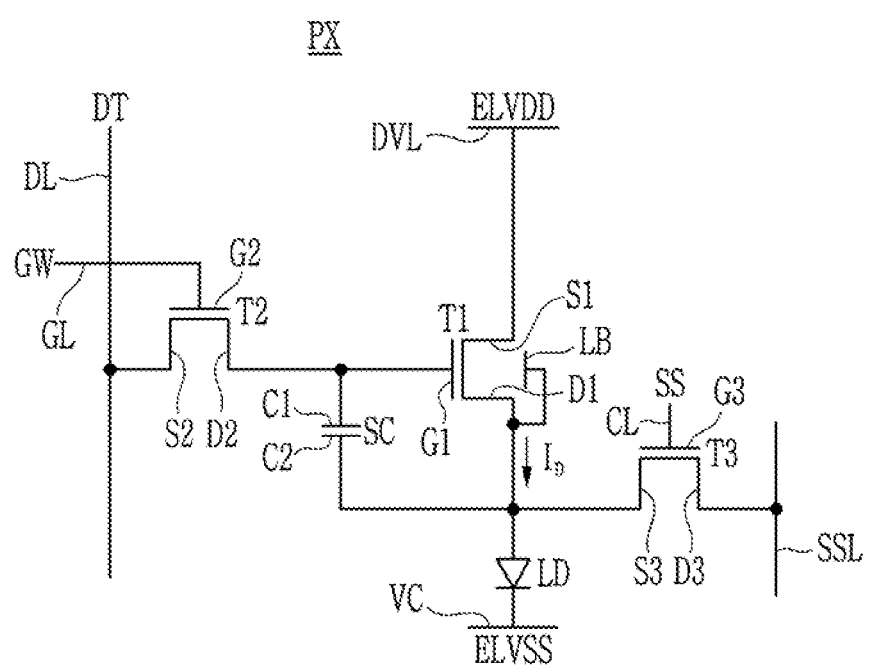
FIG. 18 is an equivalent circuit diagram illustrating a pixel in a display device according to an exemplary embodiment of the present invention.

FIG. 18 is an equivalent circuit diagram illustrating a pixel in a display device according to an exemplary embodiment of the present invention.

Referring to FIG. 18, a pixel PX includes a plurality of transistors T1, T2, and T3, a storage capacitor SC, and a light emitting element LD. The pixel PX is connected with a plurality of signal lines DL, GL, CL, SSL, DVL, and VC. In FIG. 18, a structure in which three transistors and one capacitor are formed is illustrated, but the number of transistors and the number of capacitors may be variously changed. Six signal lines are connected to the pixel PX, but the type and the number of signal lines may be various modified.

The signal lines DL, GL, CL, SSL, DVL, and VC may include a data line DL, a gate line GL, a sensing control line CL, a sensing line SSL, a driving voltage line DVL, and a common voltage line VC. The gate line GL may transmit a gate signal GW to a second transistor T2. The data line DL may transmit a data signal DR, the driving voltage line DVL may transmit a driving voltage ELVDD, and the common voltage line VC may transmit a common voltage ELVSS. The sensing control line CL may transmit a sensing signal SS, and the sensing line SSL may be connected with a sensing portion.

Transistors T1, T2, and T3 include a first transistor T1 which is a driving transistor, a second transistor T2 which is a switching transistor, and a third transistor T3 which is a sensing transistor. The transistors T1, 12, and T3 are three-terminal elements that include gate electrodes G1, G2, and G3, source electrodes S1, S2, and S3, and drain electrodes D1, D2, and D3. The source electrode and the drain electrode are not fixed, and one of two terminals, excluding the gate electrode, may be referred to as a source electrode and the other may be referred to as a drain electrode in the three terminals of the transistor.

The gate electrode G1 of the first transistor T1 is connected with a first electrode C1 of the storage capacitor SC and a drain electrode D2 of the second transistor T2. A source electrode S1 of the first transistor T1 is connected with the driving voltage line DVL. The drain electrode D1 of the first transistor T1 is connected with an anode of the light emitting element LD. In addition, the drain electrode D1 of the first transistor T1 is connected with the source electrode S3 of the third transistor T3. The first transistor T1 may supply a driving current $I_D$ that correspond to a magnitude of the data signal DT transmitted through the second transistor T2 to the light emitting element LD, and may emit light with a luminance that corresponds to the magnitude of the driving current $I_D$. Thus, various gray levels can be displayed by adjusting the amount of current flowing through the first transistor T1 according to the magnitude of the first transistor T1. The driving current $I_D$ may be related with a gate-source voltage $V_{GS}$, which is a voltage between the gate electrode G1 and the source electrode S1 of the first transistor T1. For example, as $V_{GS}$ of the first transistor T1 is increased, the driving current $I_D$ may be increased. Since a light blocking layer LB that may overlap a semiconductor layer of the first transistor T1 is connected with the drain electrode D1 of the first transistor T1, a characteristic of the first transistor T1, such as an output saturation characteristic, and the like can be improved.

The gate electrode G2 of the second transistor T2 is connected with the gate line GL, the source electrode S2 of the second transistor T2 is connected with the data line DL, and the drain electrode D2 of the second transistor T2 is connected with the gate electrode G11 of the first transistor T1 and a first electrode C1 of the storage capacitor SC. The second transistor T2 is turned on according to a gate signal GW transmitted through the gate line GL, and may perform a switching operation for transmitting the data signal DT transmitted through the data line DL to the gate electrode G1 of the first transistor T1 and the first electrode C1 of the storage capacitor SC.

The gate electrode G3 of the third transistor T3 is connected with the sensing control line CL. The source electrode S3 of the third transistor T2 is connected with the drain electrode D1 of the first transistor T1 and an anode of the light emitting element LD. The drain electrode D3 of the third transistor T3 is connected with the sensing line SSL. The third transistor T3 is a transistor for sensing a characteristic, such as a threshold voltage of the first transistor T1, which causes display quality deterioration of the third transistor T3. The third transistor T3 is turned on according to the sensing signal SS transmitted through the sensing control line CL to electrically connect the first transistor T1 and the sensing line SSL. The sensing portion connected with the sensing line SSL may sense characteristic information of the first transistor T1 during a sensing period. A data signal compensated by reflecting characteristic information sensed through the third transistor T3 during the sensing period can be generated such that a characteristic deviation of the first transistor T, which may differ per pixel PX, can be externally compensated for.

The first electrode C1 of the storage capacitor SC is connected with the gate electrode G of the first transistor T1 and the drain electrode D2 of the second transistor T2. The second electrode C2 of the storage capacitor SC is connected to the drain electrode D1 of the first transistor T1 and the anode of the light emitting element. The storage capacitor SC maintains a charged data signal DT to enable the light emitting element LD to emit light continuously for a light emission period. A cathode of the light emitting element LD may be connected to the common voltage line VC transmitting the common voltage ELVSS.

While exemplary embodiment of the present invention have been described herein with reference to the drawings, it is to be understood that the invention is not limited to the disclosed embodiments. On the contrary, the present invention it is intended to cover various modifications and equivalent arrangements included within the spirit and scope of the present disclosure.

What is claimed is:

1. A display device, comprising:
   a substrate that includes a display area and a non-display area at least partially surrounding the display area;
   a driver that is disposed in the non-display area, and includes a driver circuit including a transistor and a driver control line transmitting a control signal to the driver circuit; and
   a static electricity blocking line that is disposed in the non-display area and circumscribes the display area,
   wherein the static electricity blocking line at least partially overlaps the driver.

2. The display device of claim 1, wherein the static electricity blocking line at least partially overlaps the driver circuit.

3. The display device of claim 1, wherein the static electricity blocking line at least partially overlaps the driver control line.

4. The display device of claim 1, further comprising a dam that is disposed in the non-display area and surrounds the display area, and at least partially overlaps the static electricity blocking line.

5. The display device of claim 4, wherein a width of the static electricity blocking line is smaller than a width of a bottom surface of the dam, and the dam wholly covers the static electricity blocking line.

6. The display device of claim 4, wherein the dam comprises a lower layer and an upper layer disposed on the lower layer, and wherein the static electricity blocking line is disposed between the lower layer and the upper layer.

7. The display device of claim 4, wherein the static electricity blocking line is disposed in an upper portion the dam.

8. The display device of claim 4, wherein a width of the static electricity blocking line is larger than a width of a bottom surface of the dam, and the dam covers a part of the static electricity blocking line.

9. The display device of claim 4, further comprising a light emitting element disposed in the display area and including a first electrode, an emission layer disposed on the first electrode, and a second electrode disposed on the emission layer, wherein the second electrode extends to an area where the dam is located and covers an upper portion of the dam in the non-display area.

10. The display device of claim 9, further comprising an encapsulation layer that covers the display area and seals the light emitting element, wherein the static electricity blocking line includes a plurality of static electricity blocking lines that extend in parallel with each other, and wherein at least a part of at least one of the plurality of static electricity blocking lines is covered by the encapsulation layer, and at least another part of the at least one of the plurality of static electricity blocking lines is not covered by the encapsulation layer.

11. The display device of claim 4, wherein the static electricity blocking line comprises a plurality of static electricity blocking lines that extend in parallel with each other, and wherein the display device further comprises a connection line that connects the plurality of static electricity blocking lines with each other, and transmits a common voltage to the plurality of static electricity blocking lines.

12. The display device of claim 11, further comprising a mask support and a distance between the mask support and the display area is larger than a distance between the dam in the non-display area and the display area, and the mask support at least partially overlaps only one of the plurality of static electricity blocking lines while circumscribing the display area.

13. A display device, comprising:
   a first substrate including a display area and a non-display area at least partially surrounding the display area;
   a plurality of transistors disposed on the first substrate;
   a first electrode disposed on a first transistor of the plurality of transistors, in the display area, the first electrode being electrically connected with an electrode of the first transistor;
   an emission layer disposed on the first electrode;
   a second electrode disposed on the emission layer;
   a contact layer that is disposed between the one electrode of the first transistor and the first electrode and is electrically connected to the one electrode of the first transistor and the first electrode; and
   a static electricity blocking line that is disposed at a same layer as the contact layer in the non-display area, the static electricity blocking line surrounding the display area.

14. The display device of claim 13, further comprising a driver that includes a driver circuit including a second transistor, of the plurality of transistors, disposed in the non-display area and a driver control line that transmits a control signal to the driver circuit, wherein the static electricity blocking line at least partially overlaps the driver.

15. The display device of claim 13, further comprising a dam that is disposed in the non-display area and at least partially surrounds the display area, and at least partially overlaps the static electricity blocking line.

16. The display device of claim 15, wherein a width of the static electricity blocking line is smaller than a width of a bottom surface of the dam, and the dam wholly covers the static electricity blocking line.

17. The display device of claim 15, wherein a width of the static electricity blocking line is larger than a width of a bottom surface of the dam, and the dam covers a part of the static electricity blocking line.

18. The display device of claim 13, wherein the second electrode extends to an area where the dam is located and covers an upper portion of the dam in the non-display area.

19. A display device, comprising:
- a substrate including a display area and a non-display area at least partially surrounding the display area;
- first to third concentric static electricity blocking lines that are disposed on the non-display area and each circumscribe the display area;
- a first dam that is disposed in the non-display area and at least partially surrounds the display area, and at least partially overlaps the first static electricity blocking line;
- a second dam that is disposed in the non-display area and at least partially surrounds the display area, and at least partially overlaps the second static electricity blocking line;
- a mask support that is disposed in the non-display area and at least partially surrounds the display area, and at least partially overlaps the third static electricity blocking line; and
- a connection line that connects the first to third static electricity blocking lines to each other, and transmits a common voltage to each of the first to third static electricity blocking lines.

20. The display device of claim 19, further comprising: a light emitting element that is disposed in the display area; and an encapsulation layer that covers the display area, and seals the light emitting element, wherein the first static electricity blocking line and the second static electricity blocking line are covered by the encapsulation layer, and the third static electricity blocking line is not covered by the encapsulation layer.

* * * * *